United States Patent
Ching et al.

(10) Patent No.: US 10,658,490 B2
(45) Date of Patent: May 19, 2020

(54) STRUCTURE AND FORMATION METHOD OF ISOLATION FEATURE OF SEMICONDUCTOR DEVICE STRUCTURE

(71) Applicant: Taiwan Semiconductor Manufacturing Co., Ltd., Hsinchu (TW)

(72) Inventors: Kuo-Cheng Ching, Zhubei (TW); Shi-Ning Ju, Hsinchu (TW); Kuan-Ting Pan, Taipei (TW); Kuan-Lun Cheng, Hsinchu (TW); Chih-Hao Wang, Baoshan Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/663,089

(22) Filed: Jul. 28, 2017

(65) Prior Publication Data
US 2019/0035912 A1    Jan. 31, 2019

(51) Int. Cl.
*H01L 21/8234* (2006.01)
*H01L 29/66* (2006.01)
(Continued)

(52) U.S. Cl.
CPC .... *H01L 29/66545* (2013.01); *H01L 21/3086* (2013.01); *H01L 21/31111* (2013.01);
(Continued)

(58) Field of Classification Search
CPC ........... H01L 29/66545; H01L 29/0653; H01L 29/66795; H01L 29/66553; H01L 29/161; H01L 29/1608; H01L 29/0847; H01L 29/7851; H01L 21/823878; H01L 21/823821; H01L 21/823814; H01L 21/76224; H01L 21/31111; H01L 29/517; H01L 21/823431; H01L 21/845; H01L 21/823481

See application file for complete search history.

(56) References Cited

U.S. PATENT DOCUMENTS 8,703,557 B1 * 4/2014 Cai .................... H01L 29/6681
                                                        257/347
9,536,991 B1 * 1/2017 Zang .................. H01L 29/6681
(Continued)

*Primary Examiner* — Bitew A Dinke
(74) *Attorney, Agent, or Firm* — Birch, Stewart, Kolasch & Birch, LLP

(57) ABSTRACT

Structures and formation methods of a semiconductor device structure are provided. The semiconductor device structure includes a fin structure over a semiconductor substrate. The semiconductor device structure also includes active gate stacks over the fin structure. The semiconductor device structure further includes a dummy gate stack over the fin structure. The dummy gate stack is between the active gate stacks. In addition, the semiconductor device structure includes spacer elements over sidewalls of the dummy gate stack and the active gate stacks. The semiconductor device structure also includes an isolation feature below the dummy gate stack, the active gate stacks and the spacer elements. The isolation feature extends into the fin structure from the bottom of the dummy gate stack such that the isolation feature is surrounded by the fin structure.

20 Claims, 35 Drawing Sheets

(51) Int. Cl.
  *H01L 21/311* (2006.01)
  *H01L 21/762* (2006.01)
  *H01L 21/8238* (2006.01)
  *H01L 29/06* (2006.01)
  *H01L 29/08* (2006.01)
  *H01L 29/16* (2006.01)
  *H01L 29/161* (2006.01)
  *H01L 29/78* (2006.01)
  *H01L 21/308* (2006.01)
  *H01L 29/51* (2006.01)

(52) U.S. Cl.
  CPC ......... *H01L 21/76224* (2013.01); *H01L 21/823481* (2013.01); *H01L 21/823814* (2013.01); *H01L 21/823821* (2013.01); *H01L 21/823878* (2013.01); *H01L 29/0653* (2013.01); *H01L 29/0847* (2013.01); *H01L 29/161* (2013.01); *H01L 29/1608* (2013.01); *H01L 29/66553* (2013.01); *H01L 29/66795* (2013.01); *H01L 29/7851* (2013.01); *H01L 29/517* (2013.01)

(56) References Cited

U.S. PATENT DOCUMENTS

| | | | |
|---|---|---|---|
| 9,837,410 B1* | 12/2017 | Cheng | H01L 27/0886 |
| 2014/0001562 A1* | 1/2014 | Liaw | H01L 21/823431 257/369 |
| 2015/0035061 A1* | 2/2015 | Yoon | H01L 29/66545 257/365 |
| 2015/0115373 A1* | 4/2015 | Yu | H01L 21/823418 257/401 |
| 2015/0147860 A1* | 5/2015 | Kim | H01L 29/66795 438/283 |
| 2015/0162331 A1* | 6/2015 | Kang | H01L 22/34 257/48 |
| 2015/0325575 A1* | 11/2015 | Park | H01L 29/0653 257/401 |
| 2016/0099181 A1* | 4/2016 | Tung | H01L 21/823821 257/369 |
| 2016/0276429 A1* | 9/2016 | Tseng | H01L 29/0649 |
| 2016/0300839 A1* | 10/2016 | Kim | H01L 27/0924 |
| 2016/0336315 A1* | 11/2016 | You | H01L 27/0886 |
| 2016/0380052 A1* | 12/2016 | Kim | H01L 29/0653 257/401 |
| 2017/0005008 A1* | 1/2017 | Liou | H01L 21/823481 |
| 2017/0012000 A1* | 1/2017 | Tseng | H01L 23/535 |
| 2017/0025540 A1* | 1/2017 | Liou | H01L 29/7851 |
| 2017/0154823 A1* | 6/2017 | Tseng | H01L 21/0228 |
| 2017/0236933 A1* | 8/2017 | Basker | H01L 29/0657 257/401 |
| 2017/0317078 A1* | 11/2017 | Chang | H01L 21/30608 |
| 2017/0338323 A1* | 11/2017 | Cheng | H01L 29/6681 |
| 2017/0352740 A1* | 12/2017 | Lin | H01L 29/66545 |
| 2018/0019317 A1* | 1/2018 | Cheng | H01L 29/6681 |
| 2018/0040699 A1* | 2/2018 | Ha | H01L 29/1083 |
| 2018/0108572 A1* | 4/2018 | Zhao | H01L 21/823431 |

* cited by examiner

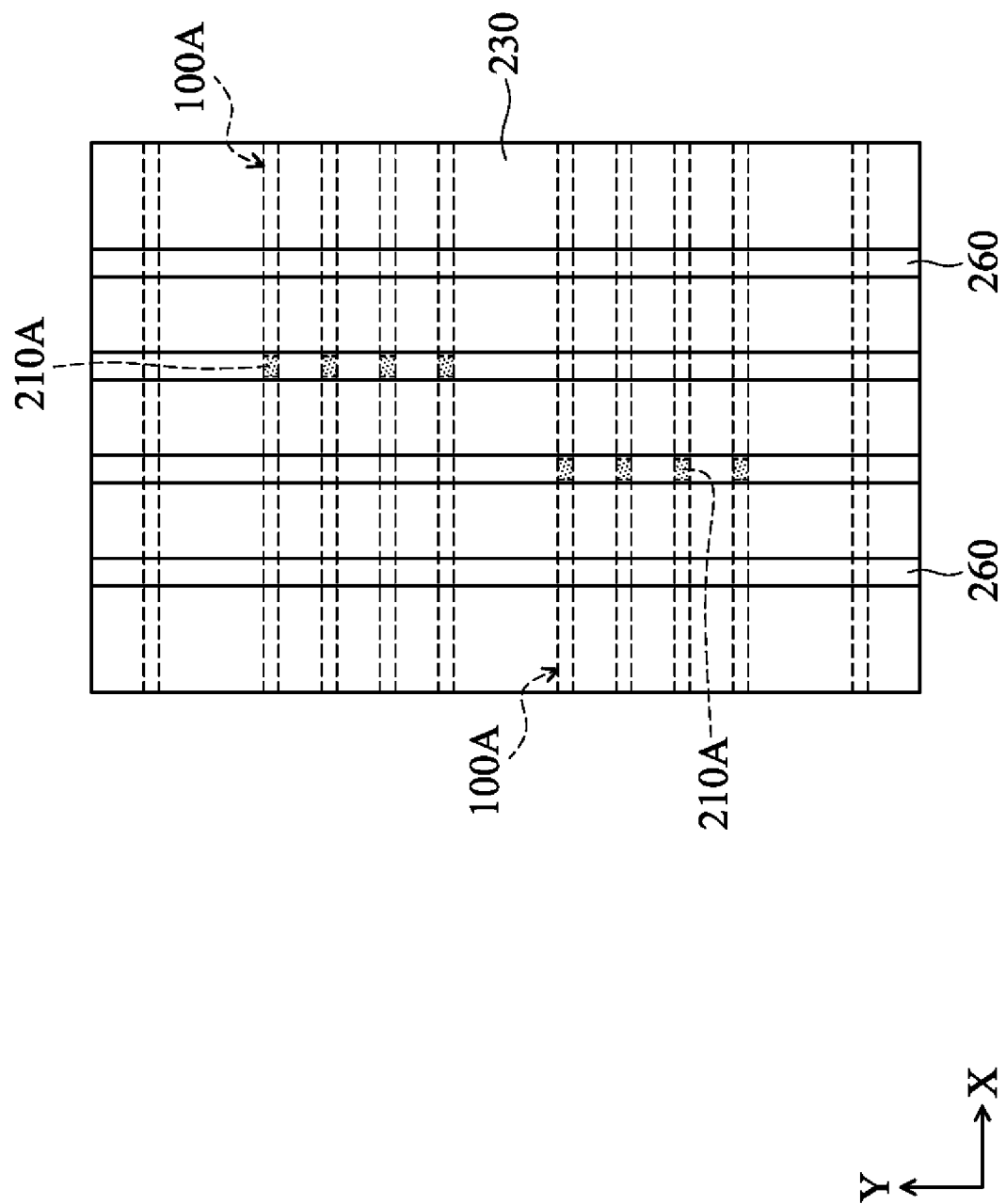

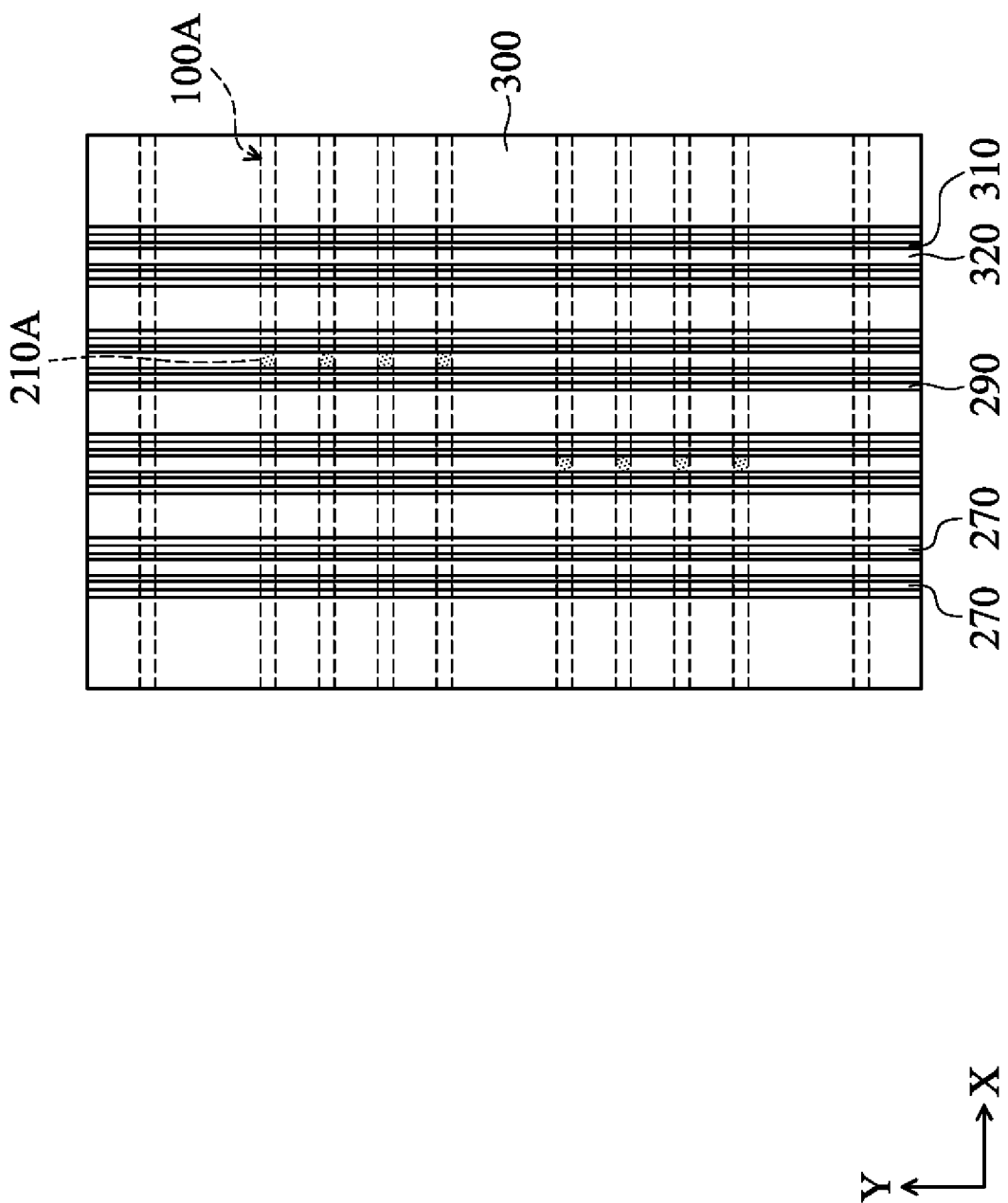

STRUCTURE AND FORMATION METHOD OF ISOLATION FEATURE OF SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a semiconductor device with fin field-effect transistors (FinFETs), has been introduced to replace planar transistors. These relatively new types of semiconductor IC devices face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1B, 2B, 3B, 4B, 5B, 6B, 7B, 8B, 9B, 10B, 11B, 12B, 13B, 14B, and 15B are top views of various stages of a process for forming a semiconductor device structure, in accordance with some embodiments.

DETAILED DESCRIPTION

Figure 1A:
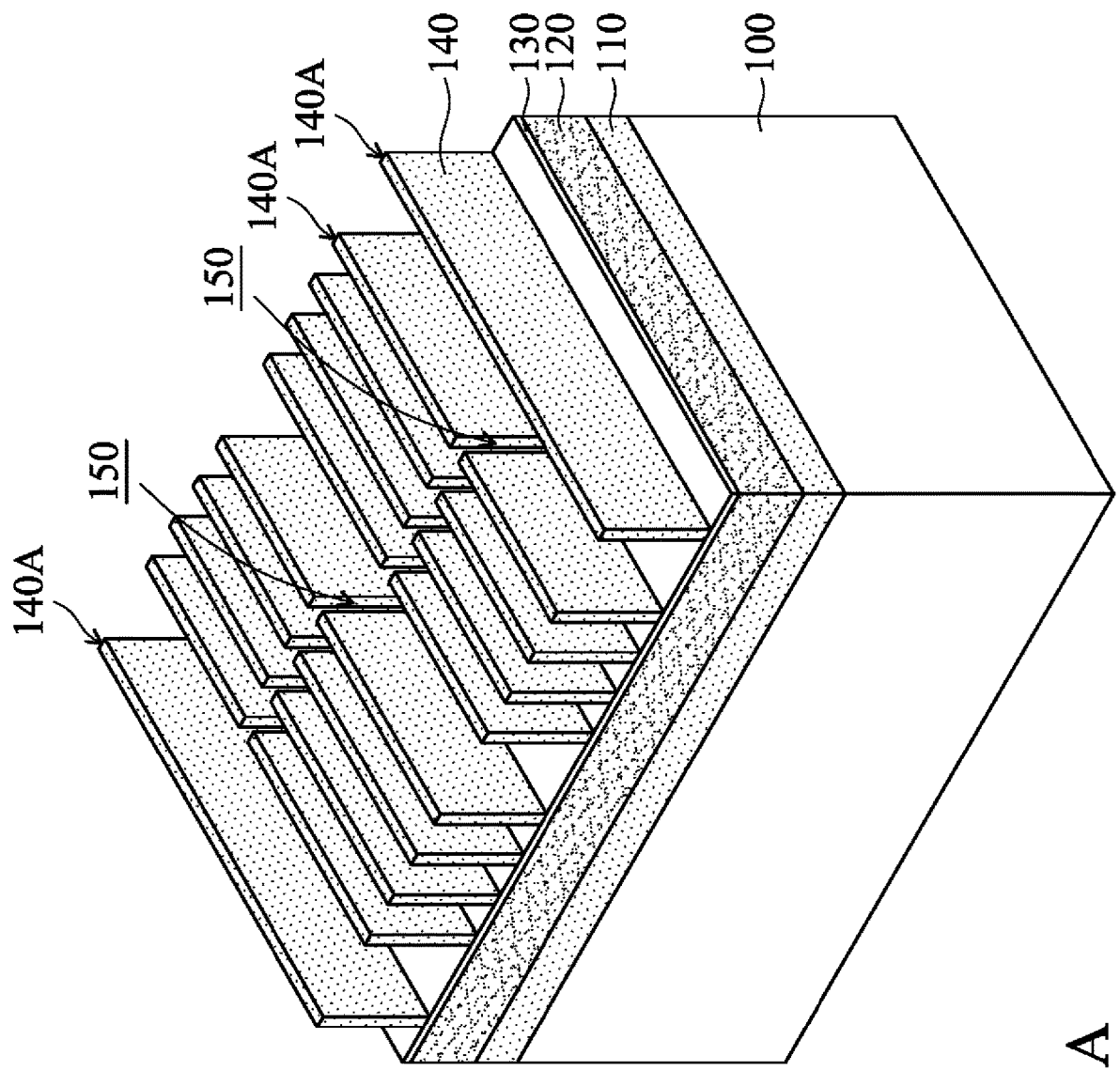
FIGS. 1A, 2A, 3A, 4A, 5A, 6A, 7A, 8A, 9A, 10A, 11A, 12A, 13A, 14A, and 15A are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated and additional features can be added for different embodiments. Although some embodiments are discussed with operations performed in a particular order, these operations may be performed in another logical order.

FIGS. 1A, 2A, 3A, 4A, 5A, 6A, 7A, 8A, 9A, 10A, 11A, 12A, 13A, 14A, and 15A are perspective views of various stages of a process for forming a semiconductor device structure, in accordance with some embodiments. For a better understanding of the semiconductor device structure, an X-Y-Z coordinate reference is provided in these figures. The X-axis is generally orientated along a substrate surface of a semiconductor device structure in the lateral direction. The Y-axis is generally oriented along the substrate surface perpendicular to the X-axis. The Z-axis is generally oriented along the substrate surface in the vertical direction perpendicular to the X-Y plane.

FIGS. 1B, 2B, 3B, 4B, 5B, 6B, 7B, 8B, 9B, 10B, 11B, 12B, 13B, 14B, and 15B are top views of various stages of a process for forming a semiconductor device structure, in accordance with some embodiments. In some embodiments, FIGS. 1B, 2B, 3B, 4B, 5B, 6B, 7B, 8B, 9B, 10B, 11B, 12B, 13B, 14B, and 15B respectively show a cross-sectional view in the X-Y plane of the semiconductor device structure shown in FIGS. 1A, 2A, 3A, 4A, 5A, 6A, 7A, 8A, 9A, 10A, 11A, 12A, 13A, 14A, and 15A.

As shown in FIG. 1A, a semiconductor substrate 100 is provided. The surface of the semiconductor substrate 100 is substantially parallel to the X-Y plane. In some embodiments, the semiconductor substrate 100 is a bulk semiconductor substrate, such as a semiconductor wafer. In some embodiments, the semiconductor substrate 100 includes silicon or another elementary semiconductor material such as germanium. For example, the semiconductor substrate 100 is a silicon wafer. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

A hard mask structure is formed over the semiconductor substrate 100. Mask layers 110, 120, 130 and 140 of the hard mask structure are shown in FIG. 1A as an example, but embodiments of the disclosure are not limited thereto. The hard mask structure may include less or more layers than those shown in FIG. 1A.

In some embodiments, the mask layers 110, 120, 130 and 140 are made of or include silicon nitride, silicon oxide, silicon oxynitride, carbon-doped oxide, silicon carbide, one or more other suitable materials, or a combination thereof. For example, the mask layers 110, 120, 130 and 140 may be made of silicon nitride, silicon oxide, carbon-doped oxide and silicon nitride, respectively. The hard mask structure may include oxide-nitride-oxide (ONO) layers. In some embodiments, each of the mask layers 110, 120, 130 and 140 is deposited using a physical vapor deposition (PVD) process, a chemical vapor deposition (CVD) process, an atomic layer deposition (ALD) process, one or more other applicable processes, or a combination thereof.

Figure 1B:
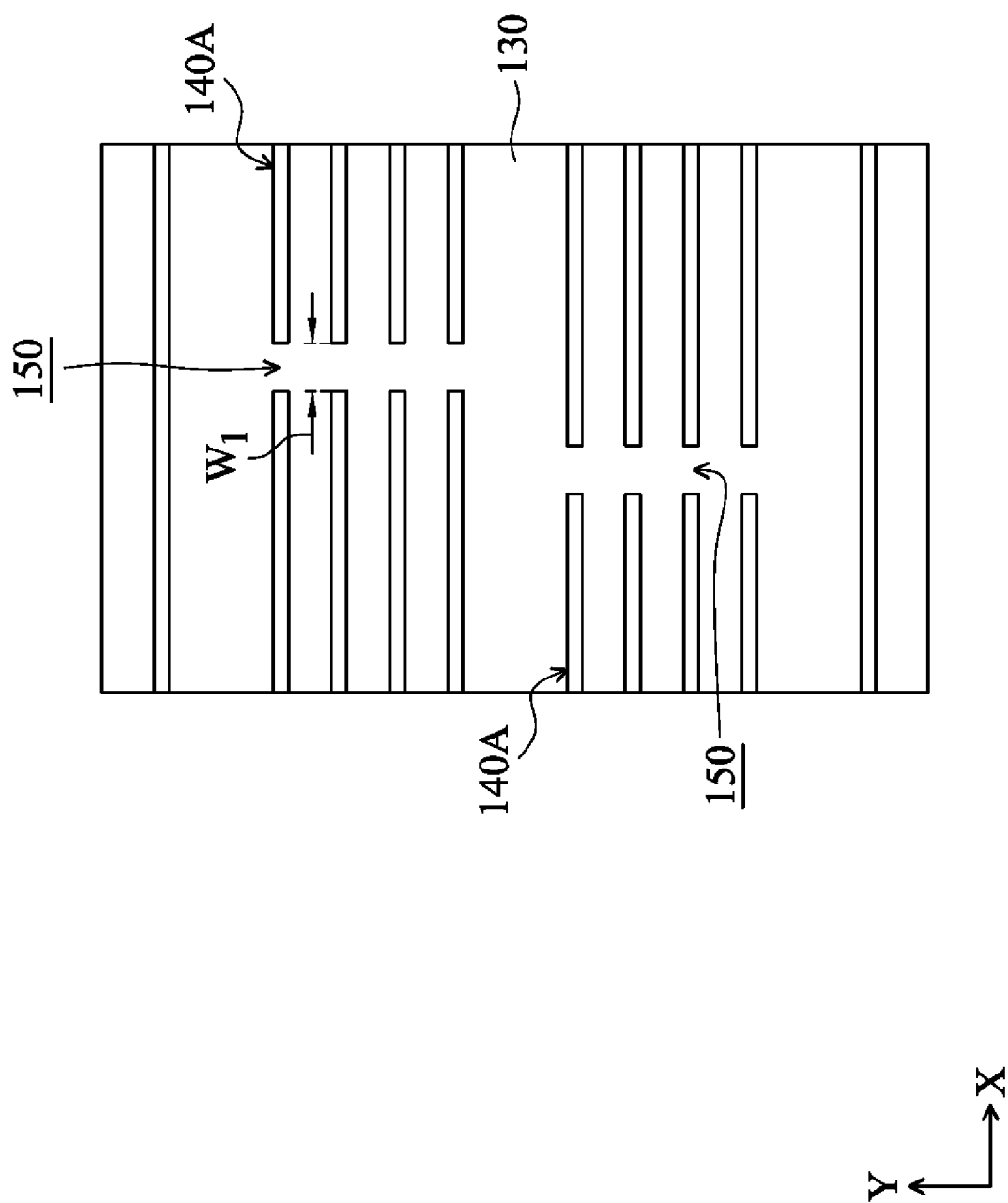

As shown in FIGS. 1A and 1B, the mask layer 140 of the hard mask structure is patterned, in accordance with some embodiments. In some embodiments, one or more photolithography and etching processes are used to form multiple recesses or trenches in the mask layer 140. As a result, multiple fin-shaped features 140A are formed between the recesses. The mask layer 130 becomes partially exposed during and after the etching process. In some embodiments, the mask layer 130 serves as an etching stop layer during the etching process.

In some embodiments, the fin-shaped features 140A extend along the X-axis and are arranged in a direction that is substantially parallel to the Y-axis, as shown in FIGS. 1A and 1B. The pitch between the fin-shaped features 140A (along the Y-axis) may or may not be the same. The thickness of the fin-shaped features 140A (along the Y-axis) may or may not be the same. The length or width of the fin-shaped features 140A (along the X-axis) may or may not be the same.

As shown in FIGS. 1A and 1B, multiple openings 150 are formed in the patterned mask layer 140, in accordance with some embodiments. Each of the openings 150 is positioned between two of the fin-shaped features 140A so as to separate and isolate them from each other. Alternatively, it may be referred to as that one fin pattern is cut into two fin-shaped features 140A by one of the openings 150.

The openings 150 are arranged in a direction that is substantially parallel to the Y-axis. In some embodiments, the openings 150 are arranged in multiple lines, as shown in FIG. 1B. However, embodiments of the disclosure are not limited thereto. In some other embodiments, the openings 150 align to each other and are arranged in a line. The openings 150 may not be arranged in a line.

The openings 150 have a width $W_1$ along the X-axis, as shown in FIG. 1B. In some embodiments, the width $W_1$ is in a range from about 15 nm to about 20 nm, but embodiments of the disclosure are not limited thereto. In some embodiments, the openings 150 are formed during the formation of the fin-shaped features 140A.

Figure 2A:
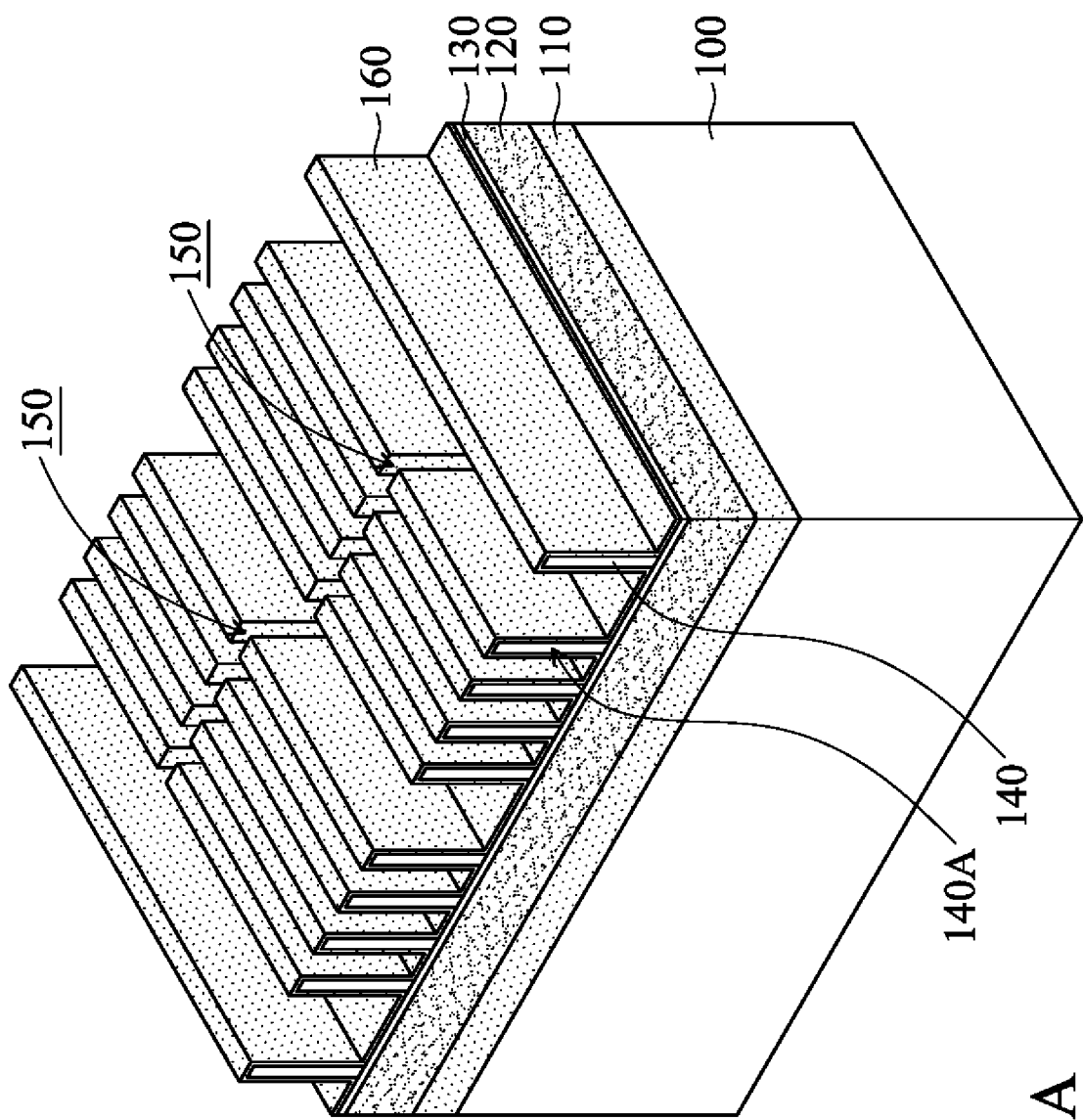
Figure 2B:
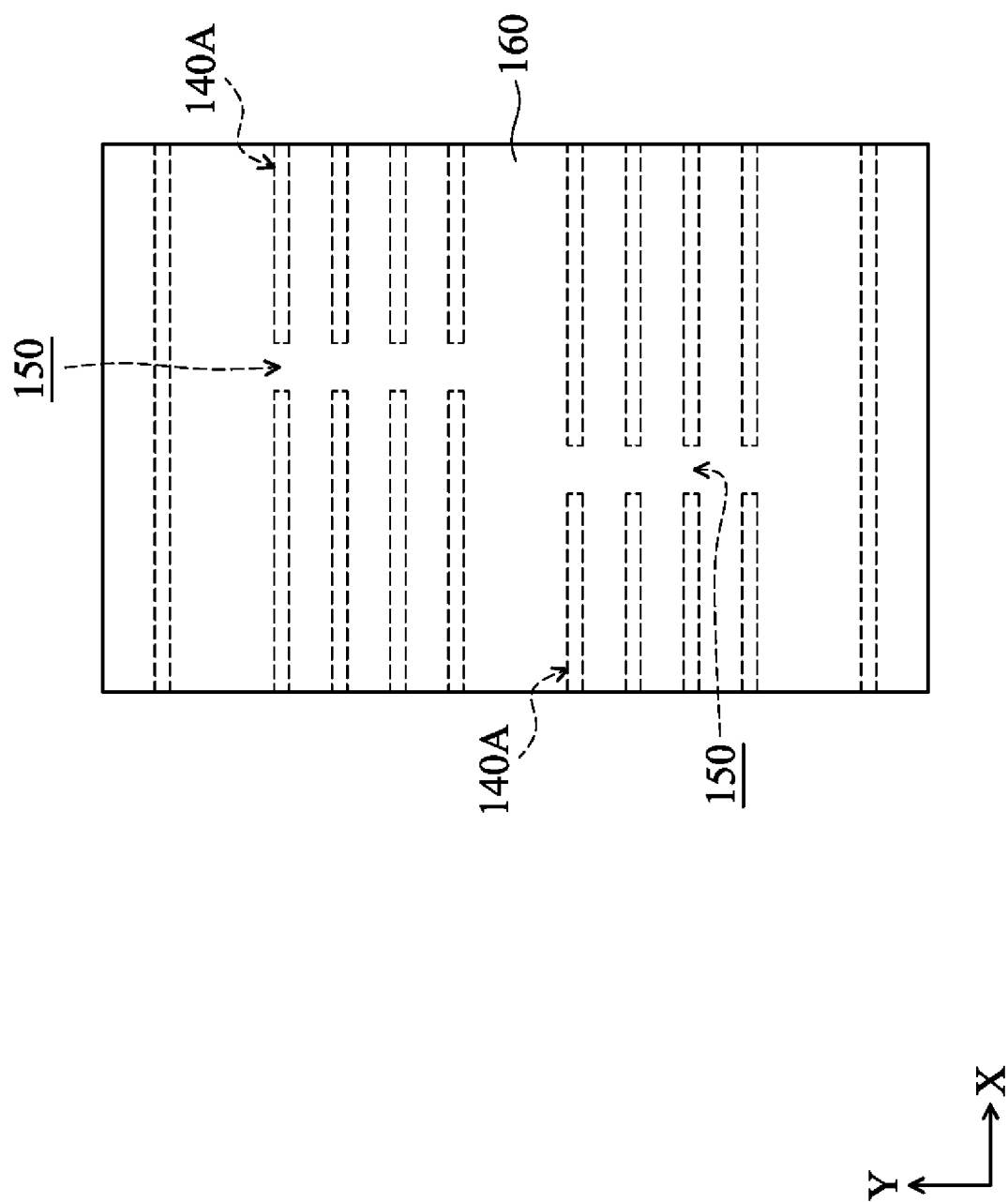

As shown in FIGS. 2A and 2B, a capping layer 160 is deposited over the mask layer 140, in accordance with some embodiments. The capping layer 160 covers the fin-shaped features 140A and partially fills the openings 150, as shown in FIG. 2A. As a result, the openings 150 become narrower and shrink due to the deposition of the capping layer 160.

In some embodiments, the thickness of the capping layer 160 is in a range from about 3 nm to about 5 nm, but embodiments of the disclosure are not limited thereto. In some embodiments, the capping layer 160 is made of or includes silicon nitride, one or more other suitable materials, or a combination thereof. In some embodiments, the capping layer 160 and the mask layer 140 are made of or include the same material. In some embodiments, the capping layer 160 is deposited using an ALD process, one or more other applicable processes, or a combination thereof. In some embodiments, the capping layer 160 is deposited conformally or uniformly.

The capping layer 160 will be removed during a subsequent process and therefore may be referred to as a sacrificial capping layer. Many variations and/or modifications can be made to embodiments of the disclosure. In some other embodiments, the capping layer 160 is not formed.

Figure 3A:
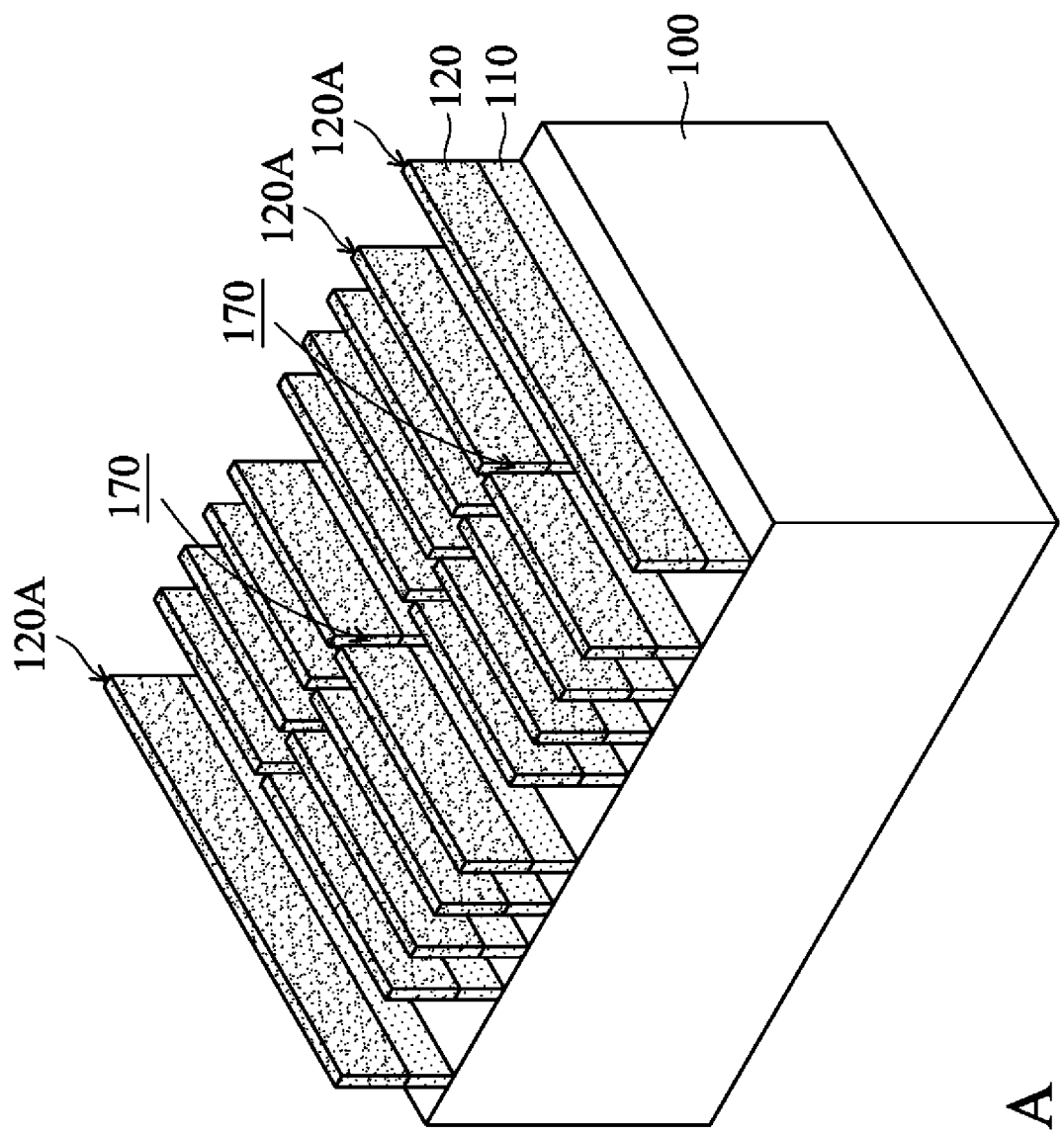
Figure 3B:
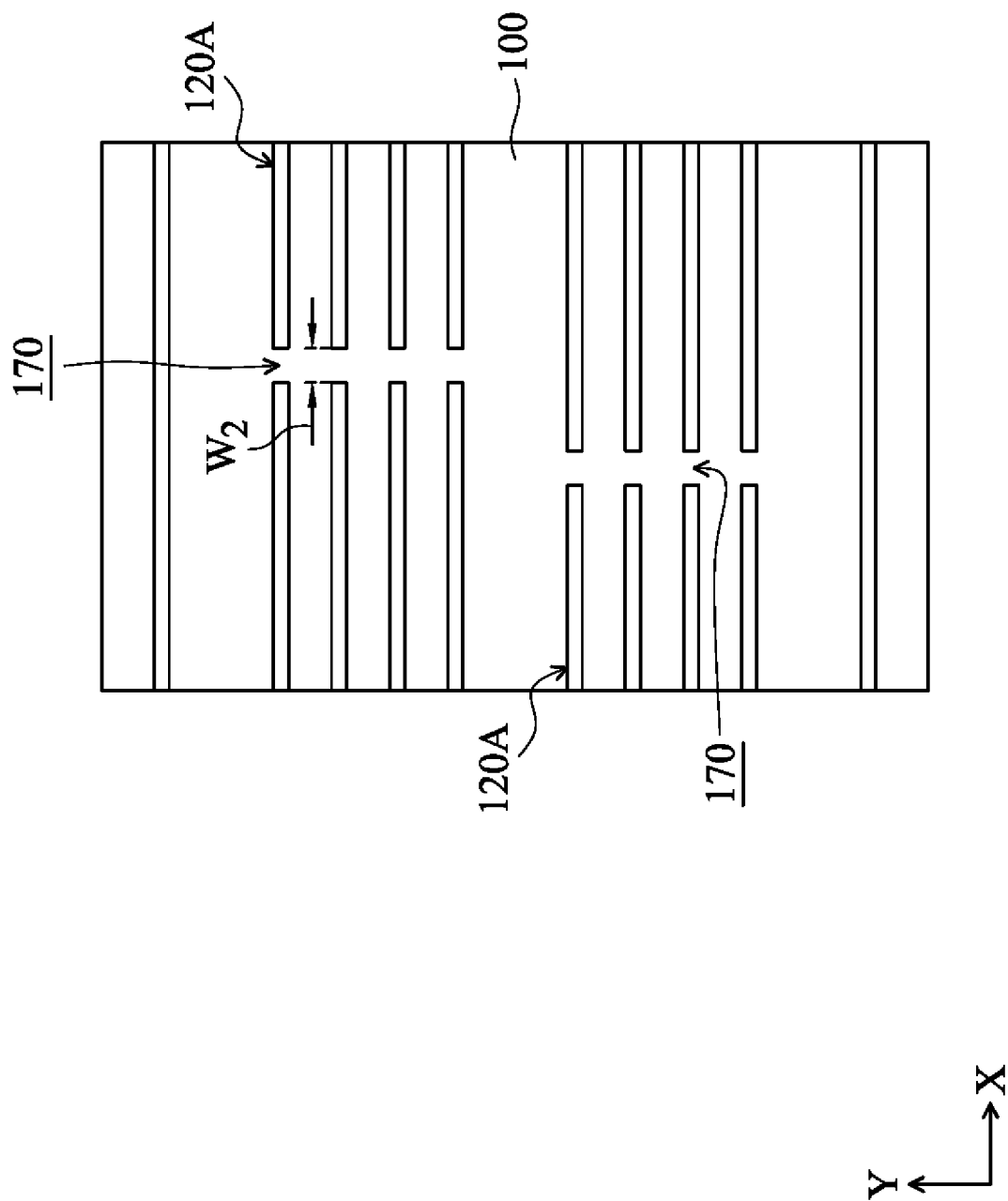

Afterwards, one or more photolithography and etching processes are performed over the mask layer 140. The mask layers 140 and 130 are removed, as shown in FIGS. 3A and 3B. The mask layers 120 and 110 are patterned so that multiple recesses or trenches are formed in the mask layers 120 and 110. As a result, multiple fin-shaped features 120A are formed between the recesses, as shown in FIGS. 3A and 3B. The semiconductor substrate 100 becomes partially exposed during and after the etching process. In some embodiments, the capping layer 160 is removed during the etching process for patterning the mask layers 120 and 110.

In some embodiments, the fin-shaped features 120A and the fin-shaped features 140A have similar or substantially the same pattern or arrangement (such as position, shape and dimension). In some embodiments, the fin-shaped features 120A are slightly wider than the fin-shaped features 140A due to the shrinkage of the openings 150.

As shown in FIGS. 3A and 3B, multiple openings 170 are formed in the patterned mask layers 120 and 110, in accordance with some embodiments. Each of the openings 170 is positioned between two of the fin-shaped features 120A so as to separate and isolate them from each other.

In some embodiments, the openings 170 and the openings 150 have similar or substantially the same pattern or arrangement (such as position, shape and dimension). In some embodiments, the openings 170 are slightly narrower than the openings 150 due to the deposition of the capping layer 160. The openings 170 have a width $W_2$ along the X-axis, as shown in FIG. 3B. In some embodiments, the width $W_2$ is in a range from about 10 nm to about 15 nm, but embodiments of the disclosure are not limited thereto. In some embodiments, the openings 170 are formed during the formation of the fin-shaped features 120A.

Figure 4A:
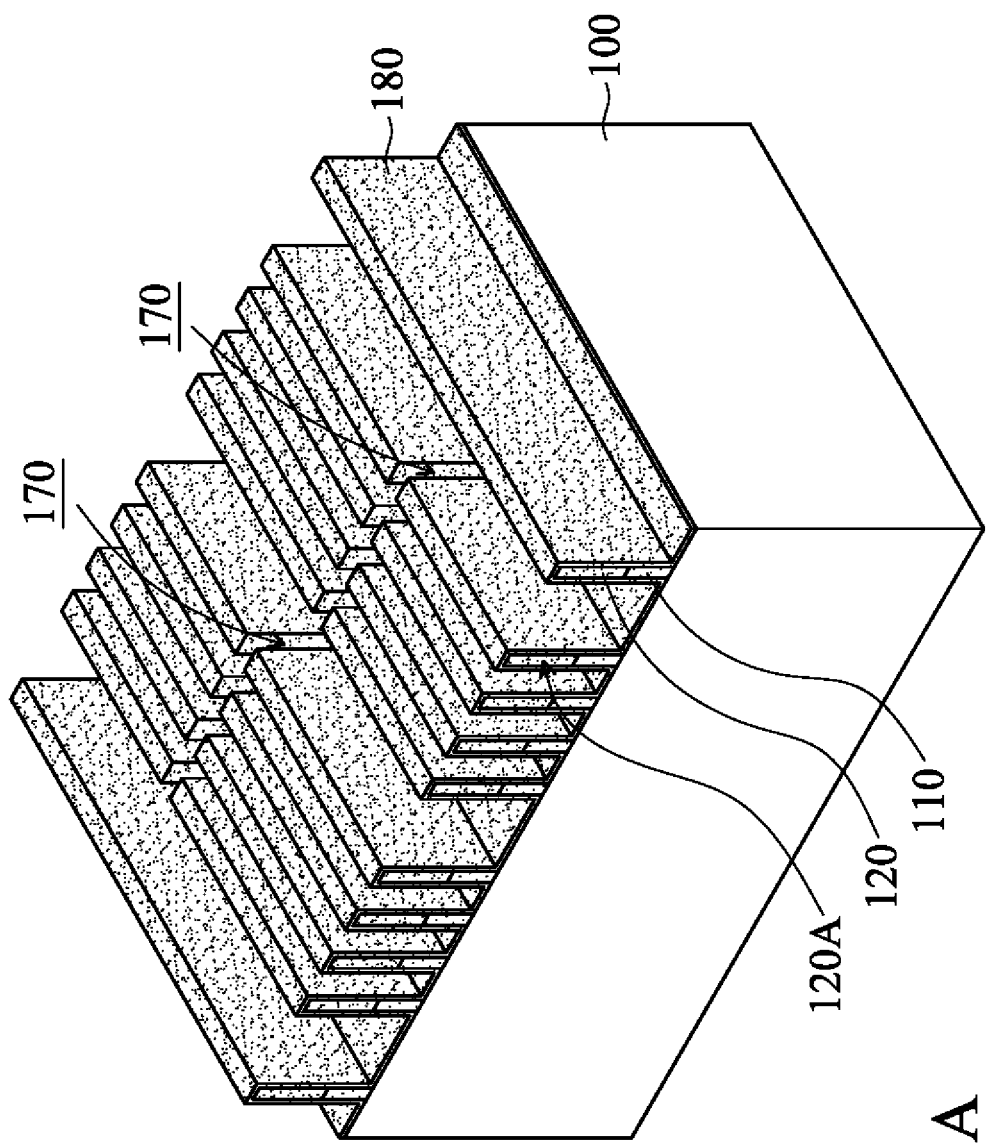
Figure 4B:
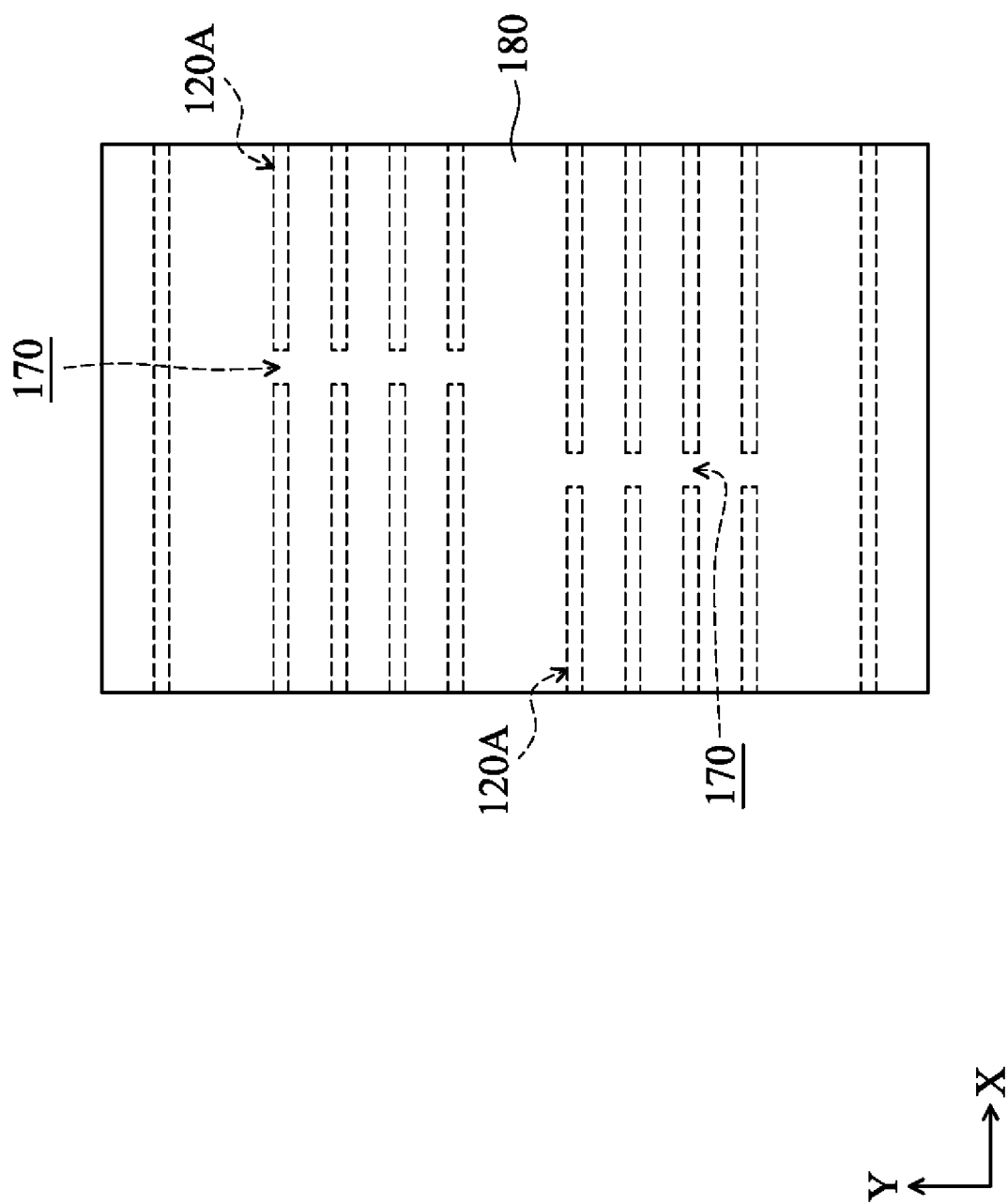

As shown in FIGS. 4A and 4B, a capping layer 180 is deposited over the mask layer 120, in accordance with some embodiments. The capping layer 180 covers the fin-shaped features 120A and partially fills the openings 170, as shown in FIG. 4A. As a result, the openings 170 become narrower and shrink due to the deposition of the capping layer 180. In some embodiments, the thickness of the capping layer 180 is in a range from about 3 nm to about 5 nm, but embodiments of the disclosure are not limited thereto. The thickness of the capping layer 180 may or may not be equal to the thickness of the capping layer 160.

In some embodiments, the capping layer 180 is made of or includes silicon oxide, one or more other suitable materials, or a combination thereof. In some embodiments, the capping layer 180 and the mask layer 120 are made of or include the same material. The capping layer 180 and the capping layer 160 are made of or include different materials. In some embodiments, the capping layer 180 is deposited using an ALD process, one or more other applicable processes, or a combination thereof. In some embodiments, the capping layer 180 is deposited conformally or uniformly.

The capping layer 180 will be removed during a subsequent process and therefore may be referred to as a sacrificial capping layer. Many variations and/or modifications can be made to embodiments of the disclosure. In some other embodiments, the capping layer 180 is not formed.

Figure 5A:
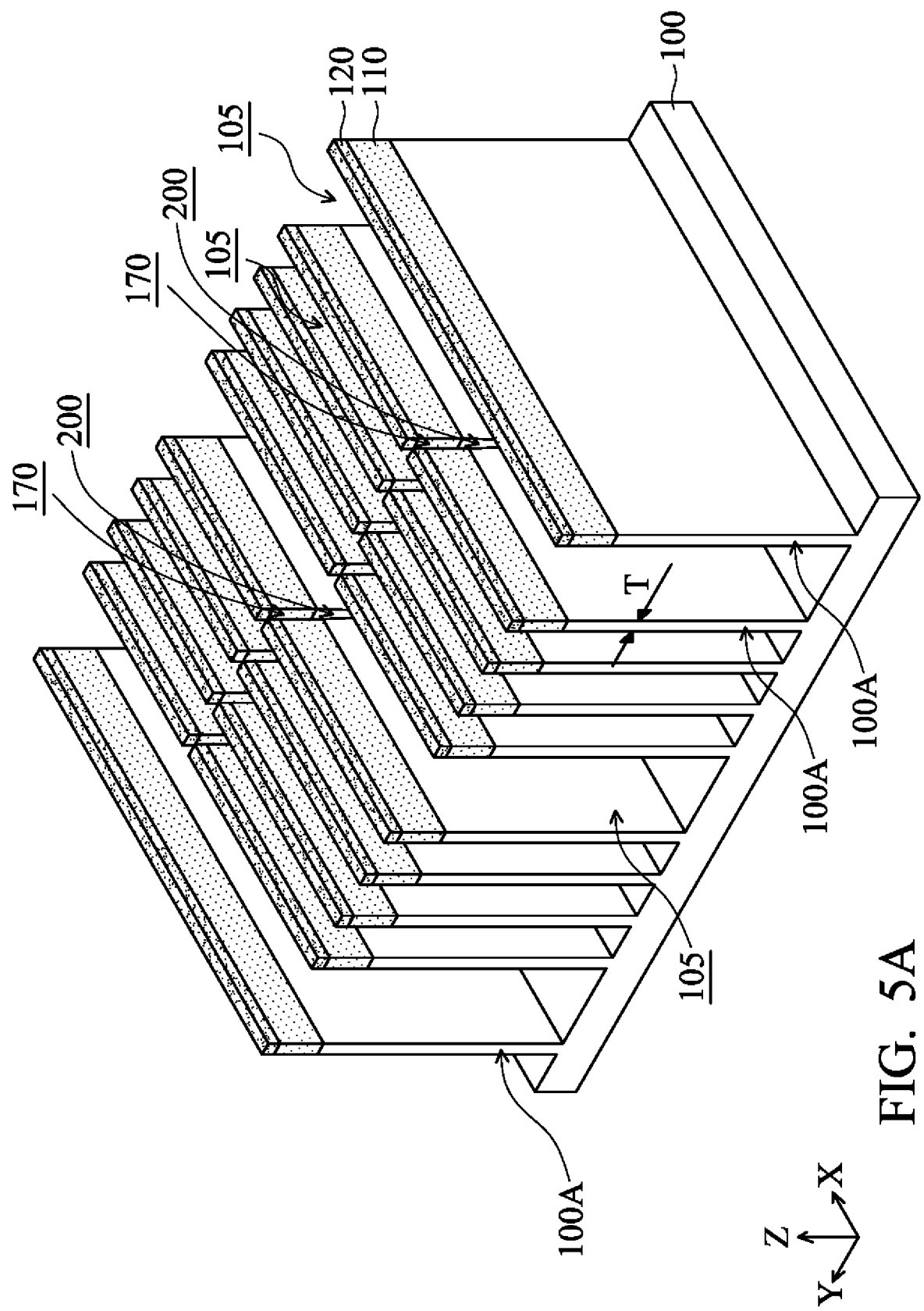
Figure 5B:
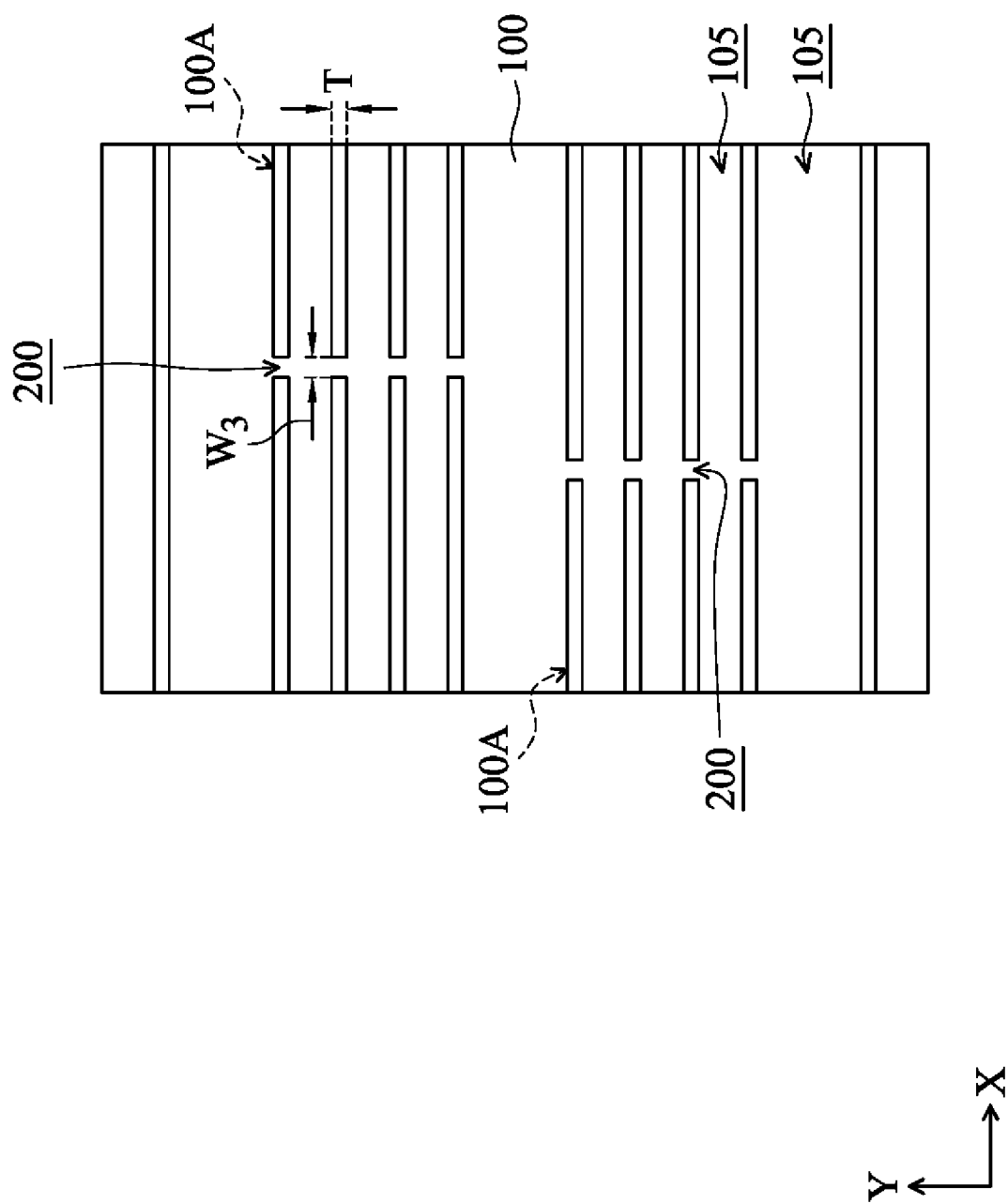

Afterwards, one or more photolithography and etching processes are performed over the mask layer 120. The mask layer 120 is thinned, as shown in FIG. 5A. The semiconductor substrate 100 is patterned so that multiple recesses (or trenches) 105 are formed in the semiconductor substrate 100. As a result, multiple fin structures 100A are formed between the recesses 105, as shown in FIGS. 5A and 5B. In some embodiments, the capping layer 180 is removed during the etching process for patterning the semiconductor substrate 100.

In some embodiments, the fin structures 100A and the fin-shaped features 120A have similar or substantially the same pattern or arrangement (such as position, shape and dimension). The fin structures 100A have a thickness T along the Y-axis, as shown in FIGS. 5A and 5B. In some embodiments, the thickness T is in a range from about 8 nm to about 12 nm, but embodiments of the disclosure are not limited thereto.

Figure 5C:
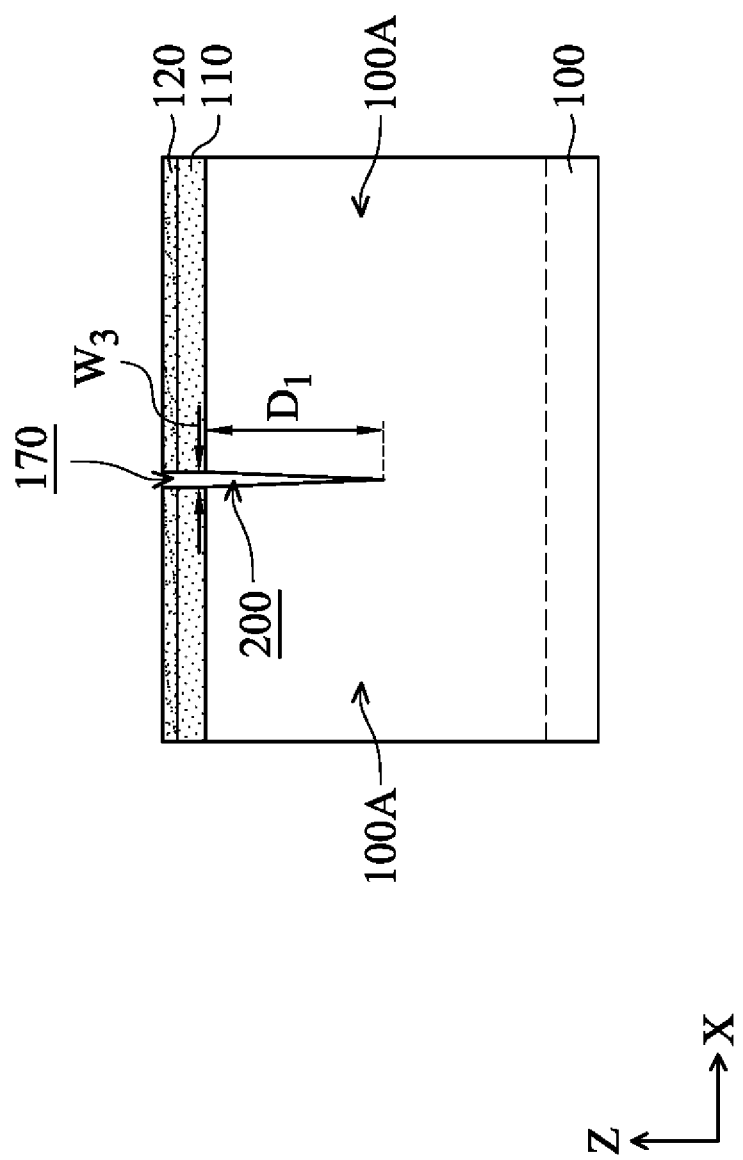
FIGS. 5C and 7C are cross-sectional views of various stages of a process for forming a semiconductor device structure, in accordance with some embodiments.

FIG. 5C is a cross-sectional view of one stage of a process for forming a semiconductor device structure, in accordance with some embodiments. In some embodiments, FIG. 5C is a cross-sectional view in the X-Z plane of the structure shown in FIG. 5A. As shown in FIGS. 5A, 5B and 5C, multiple openings 200 are formed in the fin structures 100A, in accordance with some embodiments. The openings 200 are formed during the formation of the fin structures 100A, but embodiments of the disclosure are not limited thereto.

As shown in FIGS. 5A and 5C, the openings 200 extend from the openings 170 downwards into the fin structures 100A without penetrating the fin structures 100A or the semiconductor substrate 100. Each of the openings 200 is embedded in one of the fin structures 100A. Alternatively, it may be referred to as that one of the fin structures 100A is partially cut into two fin patterns by one of the openings 200.

In some embodiments, the openings 200 and the openings 170 have similar or substantially the same pattern or arrangement (such as position, shape and dimension). The mask layer 140 shown in FIG. 1A may have a pattern corresponding to the openings 200. In some embodiments, the openings 200 are slightly narrower than the openings 170 due to the deposition of the capping layer 180. The openings 200 have a width $W_3$ along the X-axis, as shown in FIGS. 5B and 5C. In some embodiments, the width $W_3$ is in a range from about 8 nm to about 12 nm, but embodiments of the disclosure are not limited thereto. The openings 200 have a depth $D_1$ along the Y-axis, as shown in FIG. 5C. In some embodiments, the depth $D_1$ is in a range from about 70 nm to about 150 nm, but embodiments of the disclosure are not limited thereto.

In some embodiments, the openings 200 gradually shrink along a direction from the fin structures 100A towards the semiconductor substrate 100, as shown in FIG. 5C. In other words, the openings 200 shrink downwardly along the Z-axis. In some embodiments, the profile of the openings 200 in the X-Z plane is inverted triangle, as shown in FIG. 5C. The bottom of the openings 200 may be a tip. It should be noted that the profile shown in figures is only an example and is not a limitation to the disclosure.

In some cases, since feature sizes continue to decrease, fabrication processes continue to become more difficult to perform. For example, forming features at smaller sizes using photolithography and etching processes faces challenges and limitations.

In accordance with some embodiments, one or more capping layers (such as the capping layer 160 and the capping layer 180) are deposited so as to reduce the dimension of the openings 200 for forming smaller features. The dimension of the narrowed openings 200 can be fine-tuned by altering the thickness of the capping layer(s). It becomes flexible to control the dimensions of the openings 200. Accordingly, even if photolithography and/or etching processes for forming the openings 200 face critical limitations or challenges, the described formation method can be applied to form the openings 200 with much smaller sizes.

However, embodiments of the disclosure are not limited thereto. In some other embodiments, the described stages shown in FIGS. 2A and 2B and/or FIGS. 4A and 4B are eliminated.

Figure 6A:
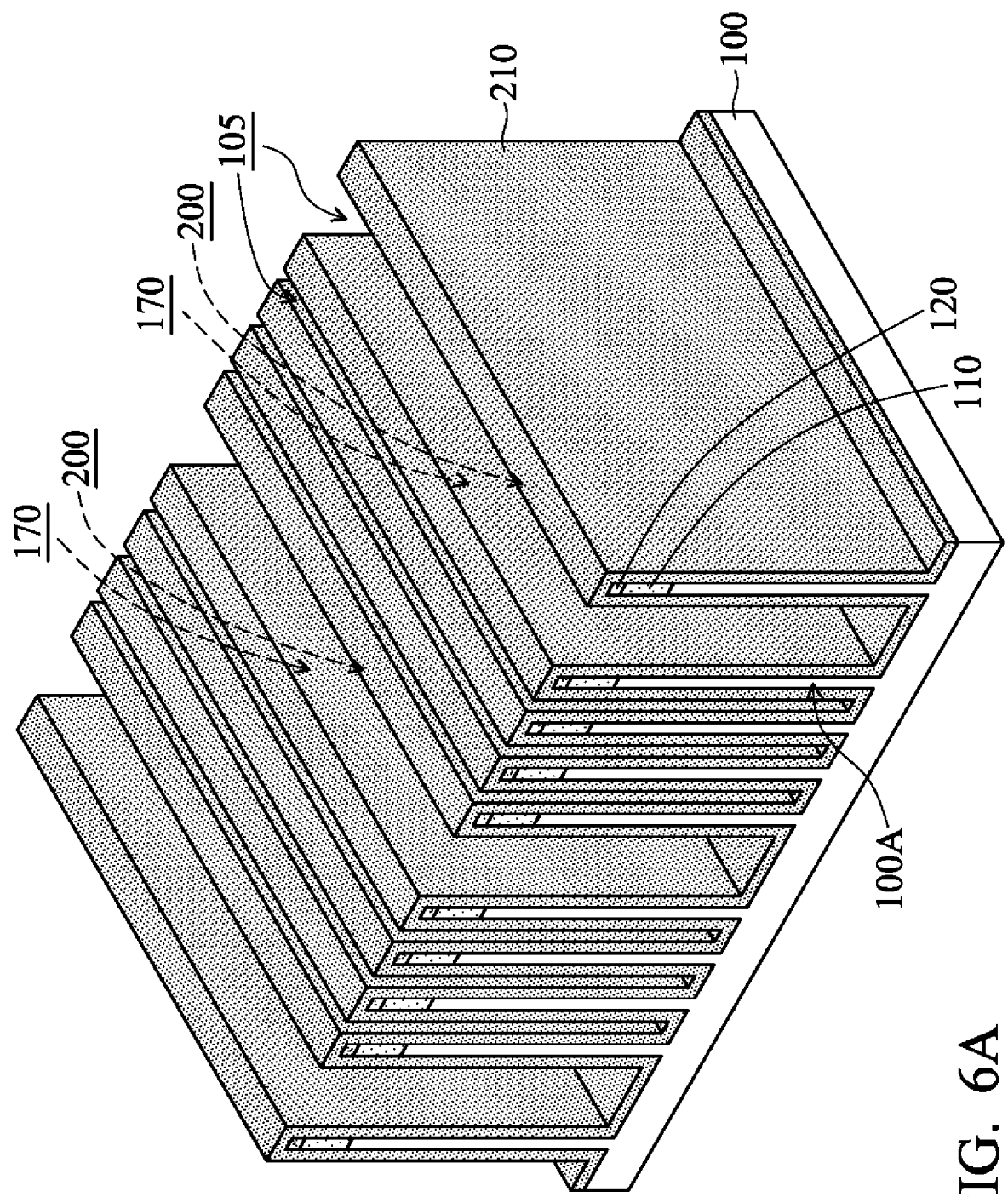
Figure 6B:
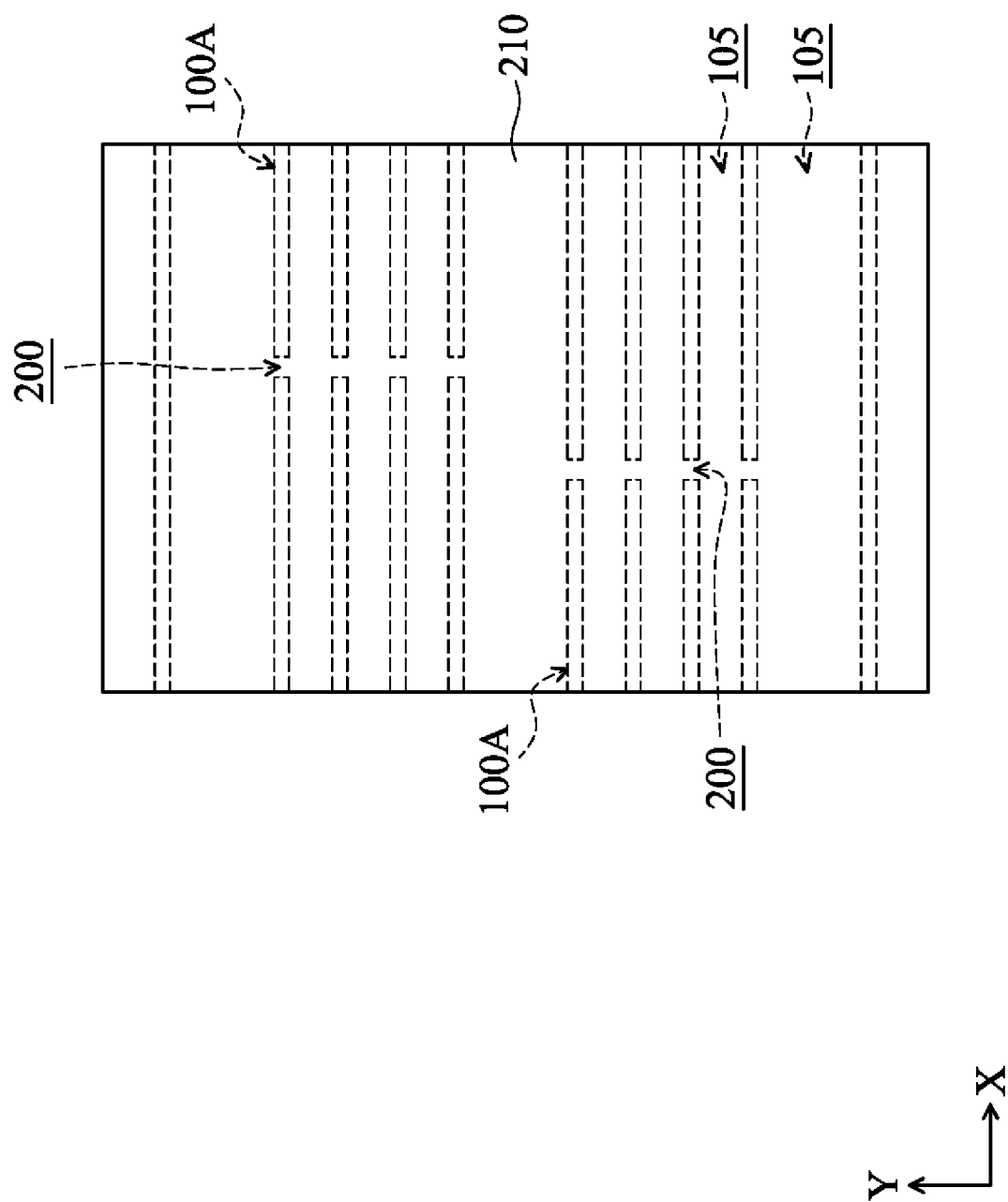

Afterwards, an isolation layer 210 is deposited over the mask layer 120, as shown in FIGS. 6A and 6B. The isolation layer 210 partially fills the recesses 105 between the fin structures 100A. The fin structures 100A are covered and surrounded by the isolation layer 210. The isolation layer 210 further fills the openings 200 and the openings 170.

The isolation layer 210 is made of a dielectric material. The dielectric material may be a low dielectric constant (low-k) material or another suitable isolation material. The low-k material may have a smaller dielectric constant than that of silicon dioxide. For example, the low-k material may have a dielectric constant in a range from about 1.5 to about 3.5. In some embodiments, the isolation layer 210 is made of or includes SiOCN, SiCN, SiOC, one or more other suitable materials, or a combination thereof. In some embodiments, the isolation layer 210 and the mask layers 120 and 110 are made of or include different materials.

In some embodiments, the isolation layer 210 is deposited using an ALD process, a PVD process, a CVD process, one or more other applicable processes, or a combination thereof. In some embodiments, the isolation layer 210 is deposited conformally or uniformly. In some embodiments, the isolation layer 210 is deposited until the openings 200 are fully filled with the isolation layer 210.

Figure 7A:
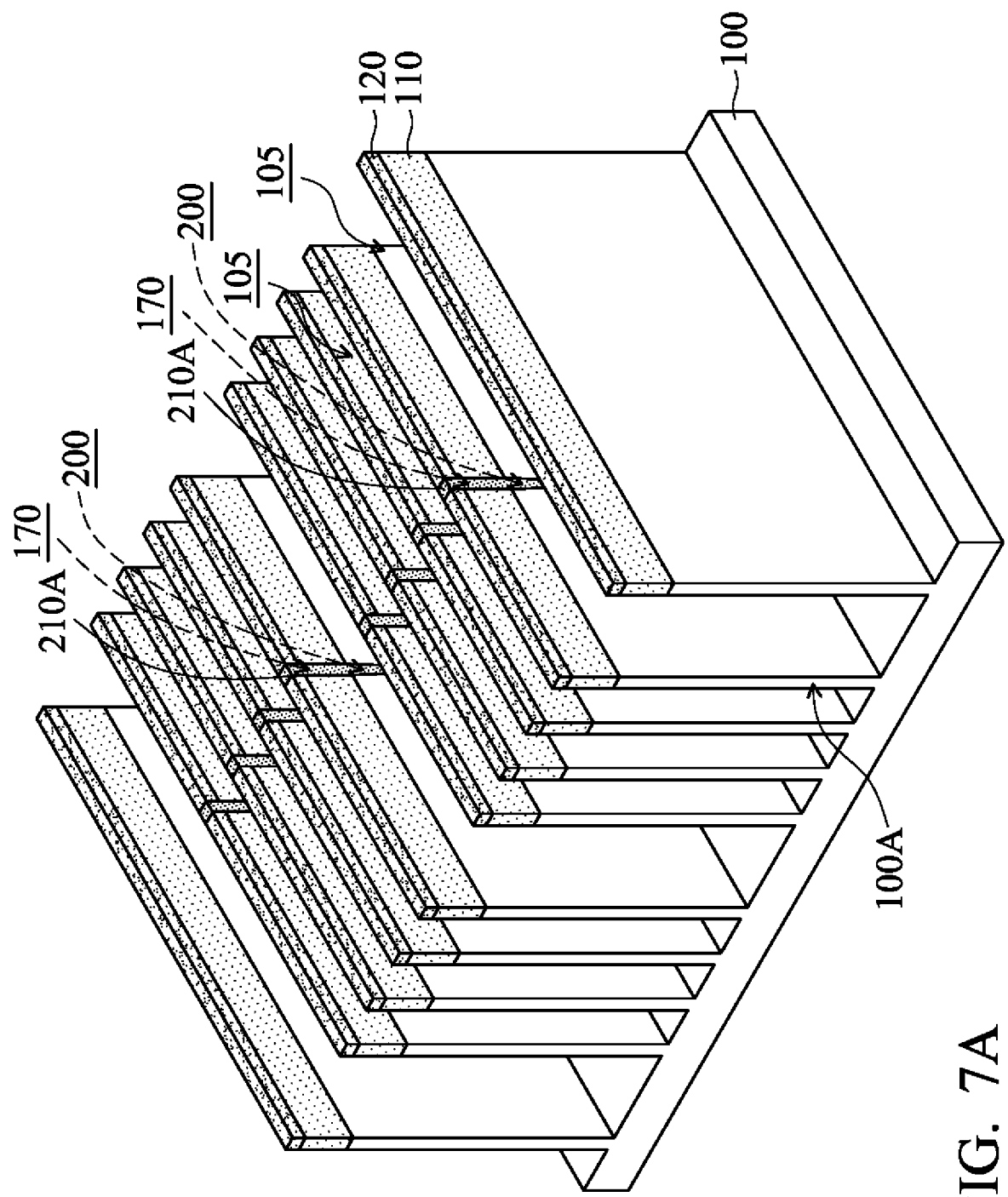
Figure 7B:
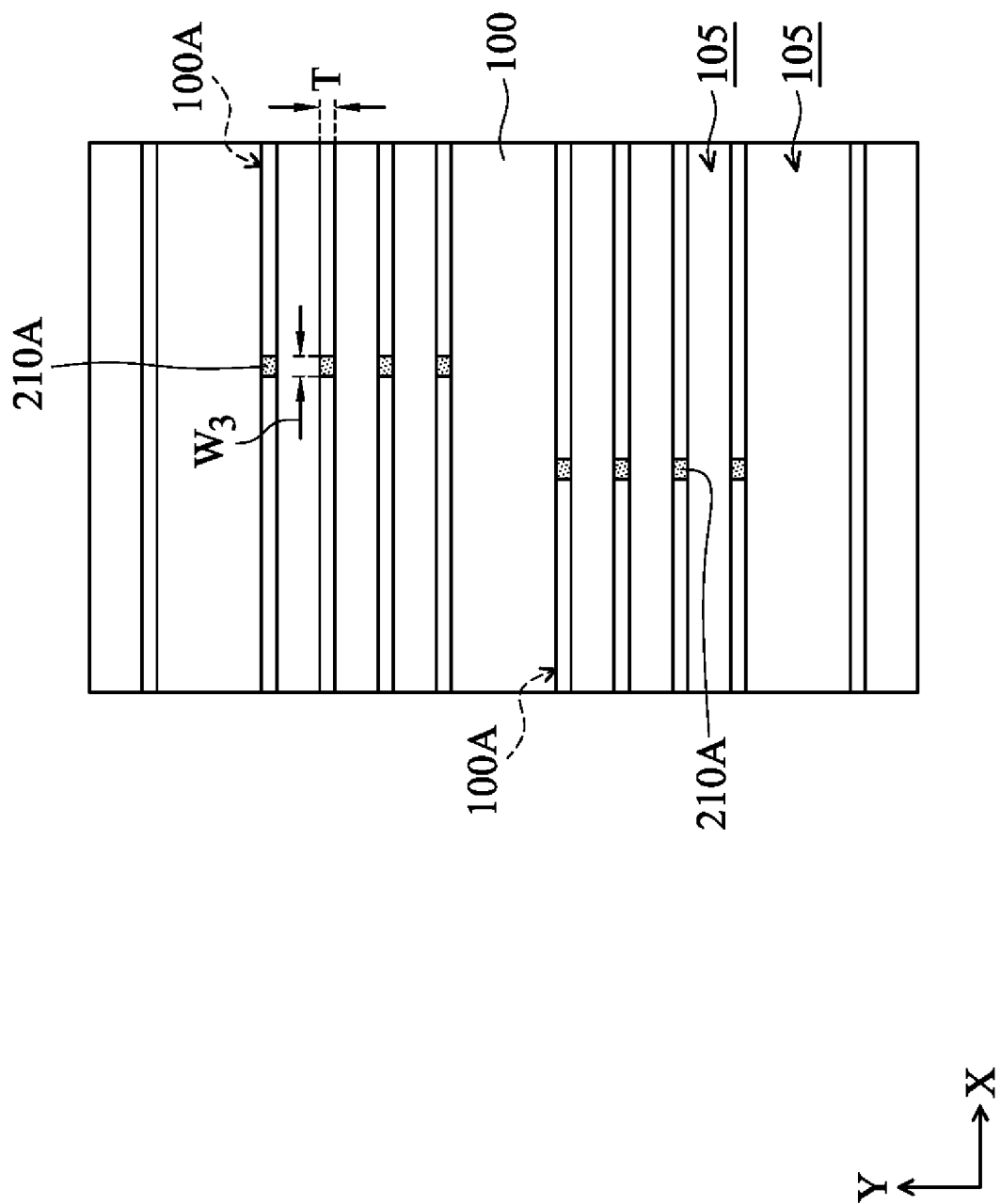

Subsequently, one or more photolithography and etching processes are performed over the isolation layer 210 until the fin structures 100A become exposed, as shown in FIGS. 7A and 7B. The isolation layer 210 covering the fin structures 100A may be removed using cycle of multiple etching processes. In some embodiments, the etchant for removing the isolation layer 210 is made of or includes ozone ($O_3$), dilute hydrofluoric acid (HF), one or more other suitable etchants, or a combination thereof. For example, the isolation layer 210 may be removed by $O_3$ and/or HF, but embodiments of the disclosure are not limited thereto. The isolation layer 210 may be oxidized first using an ashing process and then removed by $O_3$ and/or HF.

After the etching processes, some portions of the isolation layer 210 in the recesses 105 are removed while other portions of the isolation layer 210 remain in the openings 200 and the openings 170. As a result, the remaining portions of the isolation layer 210 in the openings 200 and the openings 170 form multiple isolation features 210A. The isolation features 210A are used to electrically isolate active gate stacks or various devices (such as transistors) in multiple active regions from each other, which will be described in more detail later.

It should be noted that the isolation features 210A may have rounded edges or corners due to the etching processes. The rounded parts of the isolation features 210A are not shown in figures for the purpose of simplicity and clarity.

Figure 7C:
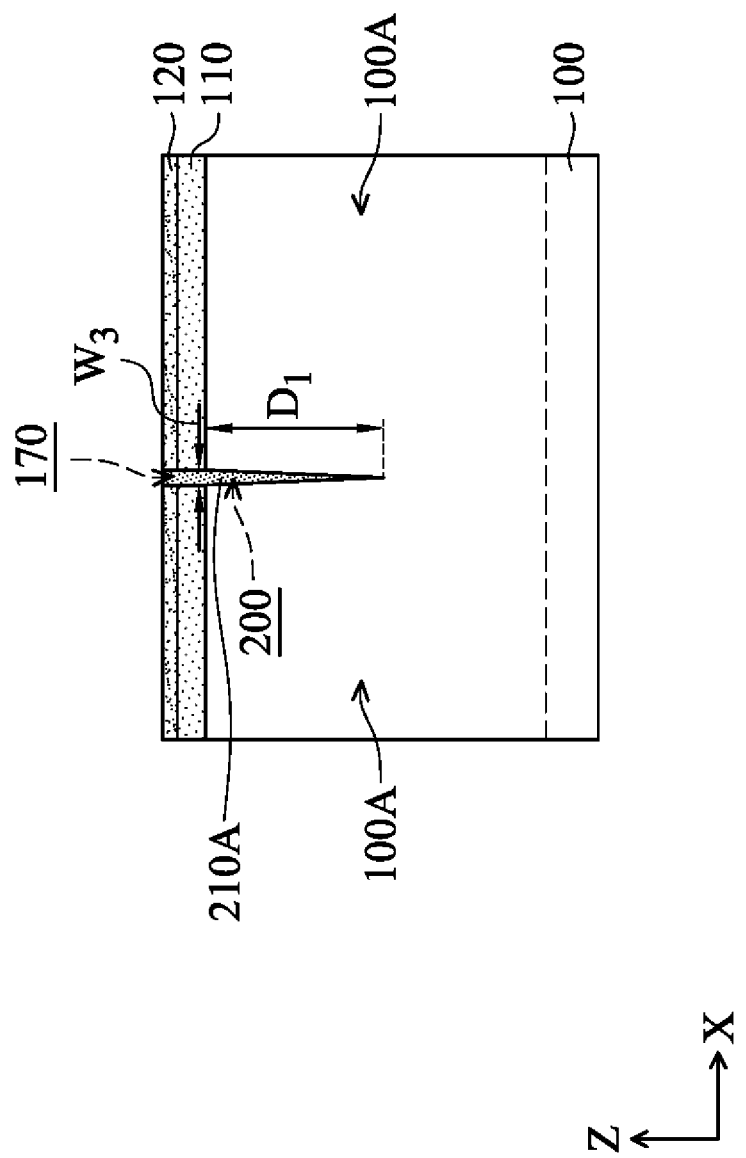

FIG. 7C is a cross-sectional view of one stage of a process for forming a semiconductor device structure, in accordance with some embodiments. In some embodiments, FIG. 7C is a cross-sectional view in the X-Z plane of the structure shown in FIG. 7A. As shown in FIGS. 7A, 7B and 7C, the isolation features 210A are embedded in the mask layers 120 and 110 and the fin structures 100A, in accordance with some embodiments. Each of the isolation features 210A is positioned between one of the fin structures 100A so as to partially separate it into two fin patterns. One of the isolation features 210A is sandwiched between two fin patterns. In some embodiments, the isolation features 210A are in direct contact with the fin structures 100A.

The isolation features 210A and the fin structures 100A may have the same thickness T. In some embodiments, the thickness of the isolation features 210A (shown in FIG. 7A) is in a range from about 8 nm to about 12 nm, such as about 10 nm. In some embodiments, the width $W_3$ of the isolation features 210A (shown in FIGS. 7B and 7C) is in a range from about 8 nm to about 12 nm, such as about 10 nm. In some embodiments, the depth $D_1$ of the isolation features 210A in the fin structures 100A (shown in FIG. 7C) is in a range from about 70 nm to about 150 nm.

In some embodiments, the isolation features 210A gradually shrink along a direction from the fin structures 100A towards the semiconductor substrate 100, as shown in FIG. 7C. The bottom of the isolation features 210A may be a tip in the fin structures 100A. In some embodiments, the profile of the isolation features 210A in the X-Z plane is inverted triangle or V-shaped.

Figure 8A:
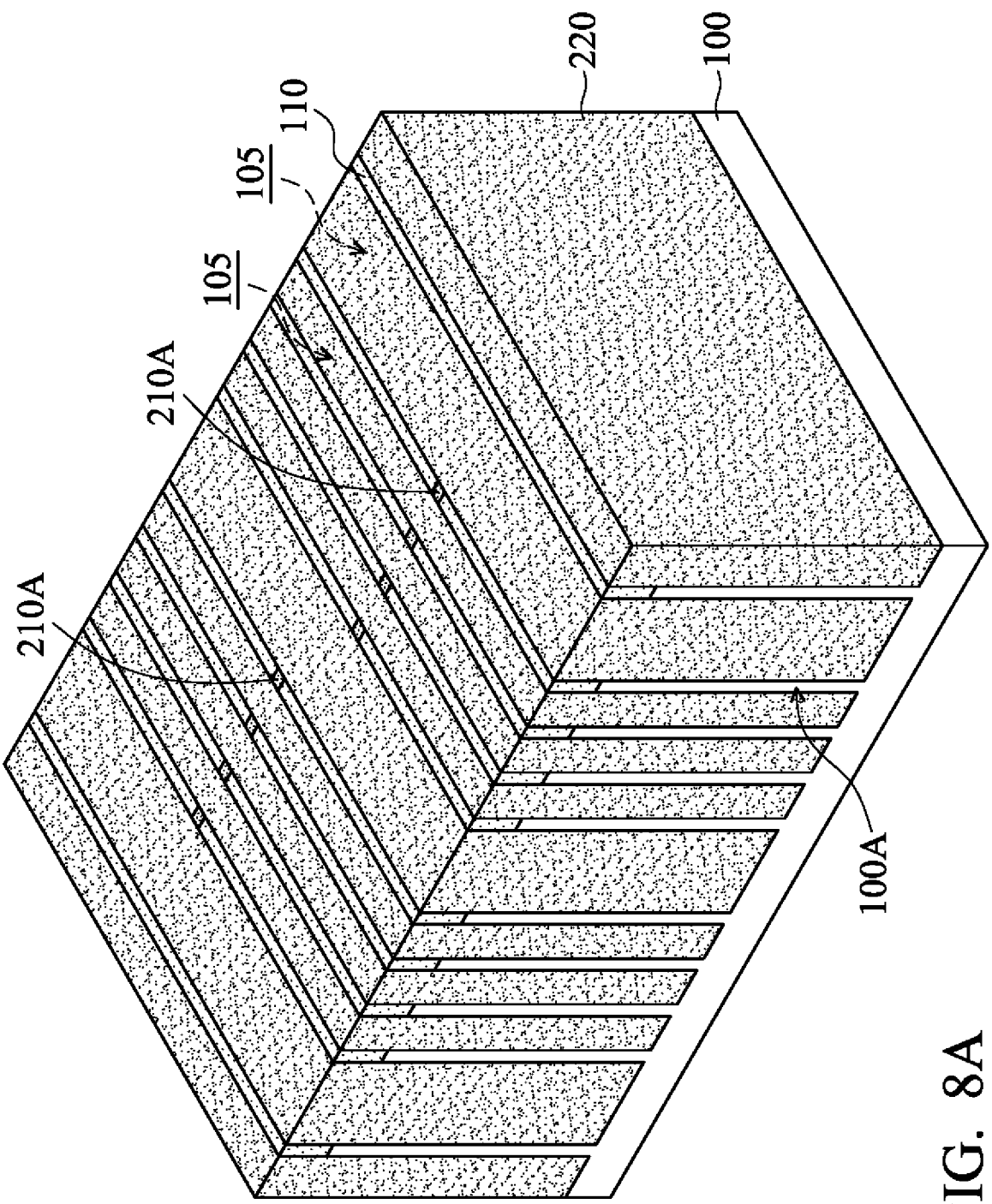
Figure 8B:
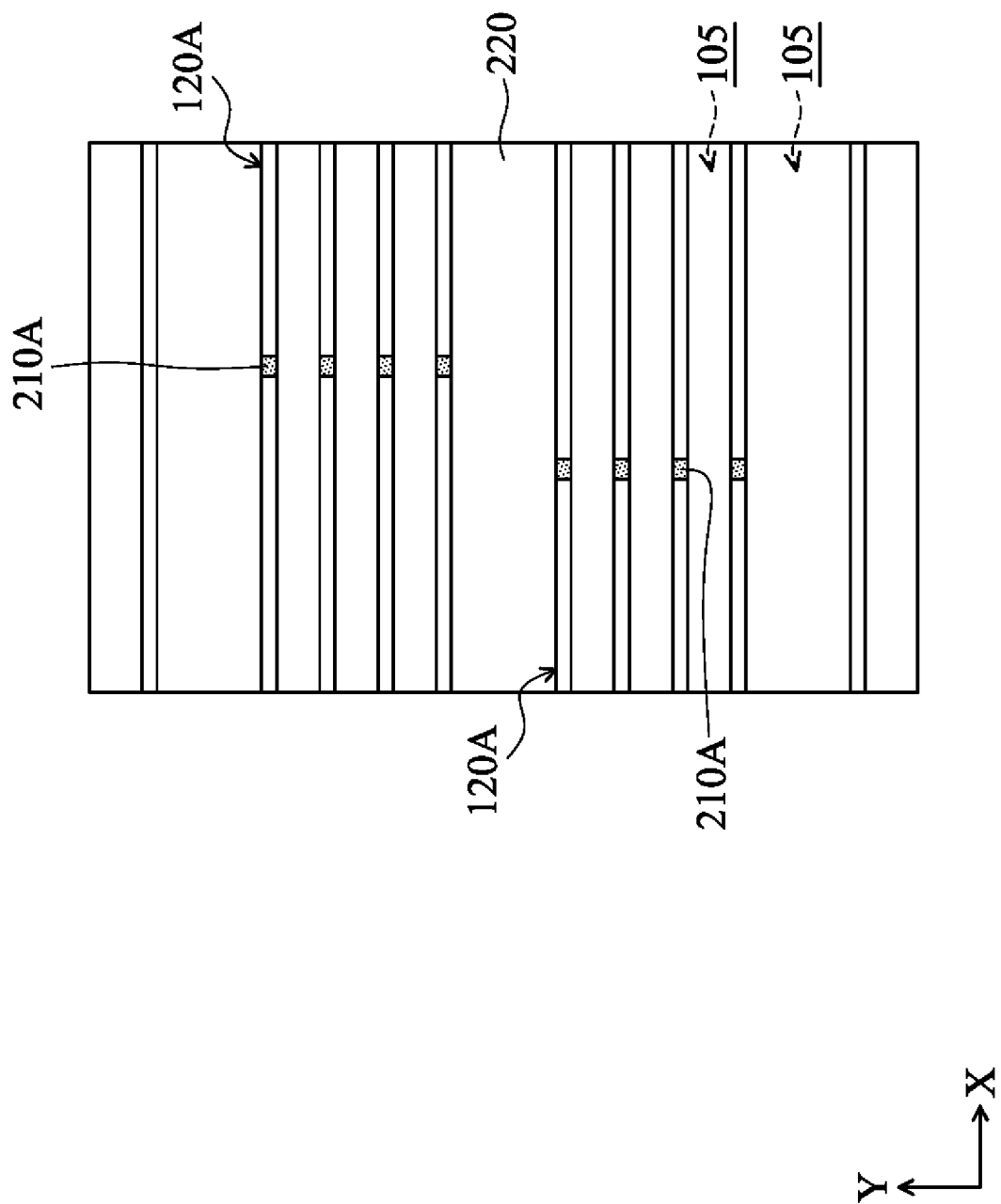

As shown in FIGS. 8A and 8B, an isolation layer 220 is deposited over the fin structures 100A, in accordance with some embodiments. The isolation layer 220 fills the recesses 105 and surrounds the fin structures 100A. In some embodiments, the isolation layer 220 is in direct contact with the isolation features 210A.

The isolation layer 220 is made of or includes a dielectric material. In some embodiments, the isolation layer 220 is made of or includes silicon oxide, silicon nitride, silicon oxynitride, spin-on glass, low-K dielectric material, one or more other suitable materials, or a combination thereof. In some embodiments, the isolation layer 220 and the isolation layer 210 are made of or include different materials. In some embodiments, the isolation layer 220 is deposited using a CVD process, a spin-on process, one or more other applicable processes, or a combination thereof.

In some embodiments, the isolation layer 220 is deposited over the mask layer 120. A planarization process is then performed to thin down the isolation layer 220 until the isolation features 210A are exposed. The planarization process may include a chemical mechanical polishing (CMP) process, a grinding process, an etching process, one or more other applicable processes, or a combination thereof.

In some embodiments, the mask layer 110 serves as a polishing stop layer during the CMP process. The planarization process is performed over the mask layer 120 until the mask layer 110 becomes exposed. As a result, the mask layer 120 is removed after the planarization process, as shown in FIG. 8A. The isolation features 210A may be partially removed during the planarization process. For example, the upper portion of the isolation features 210A (in the openings 170) may be removed.

Figure 9A:
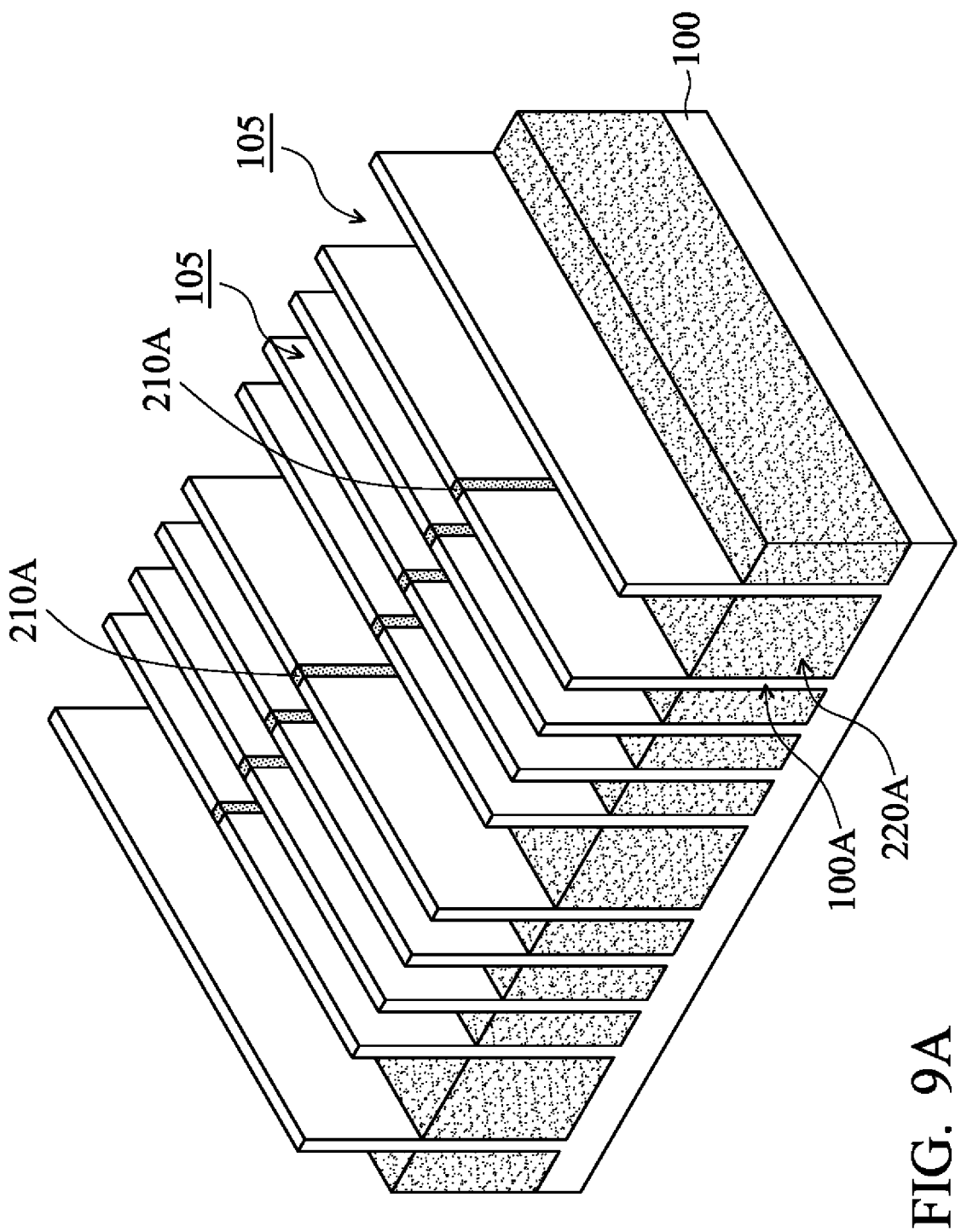
Figure 9B:
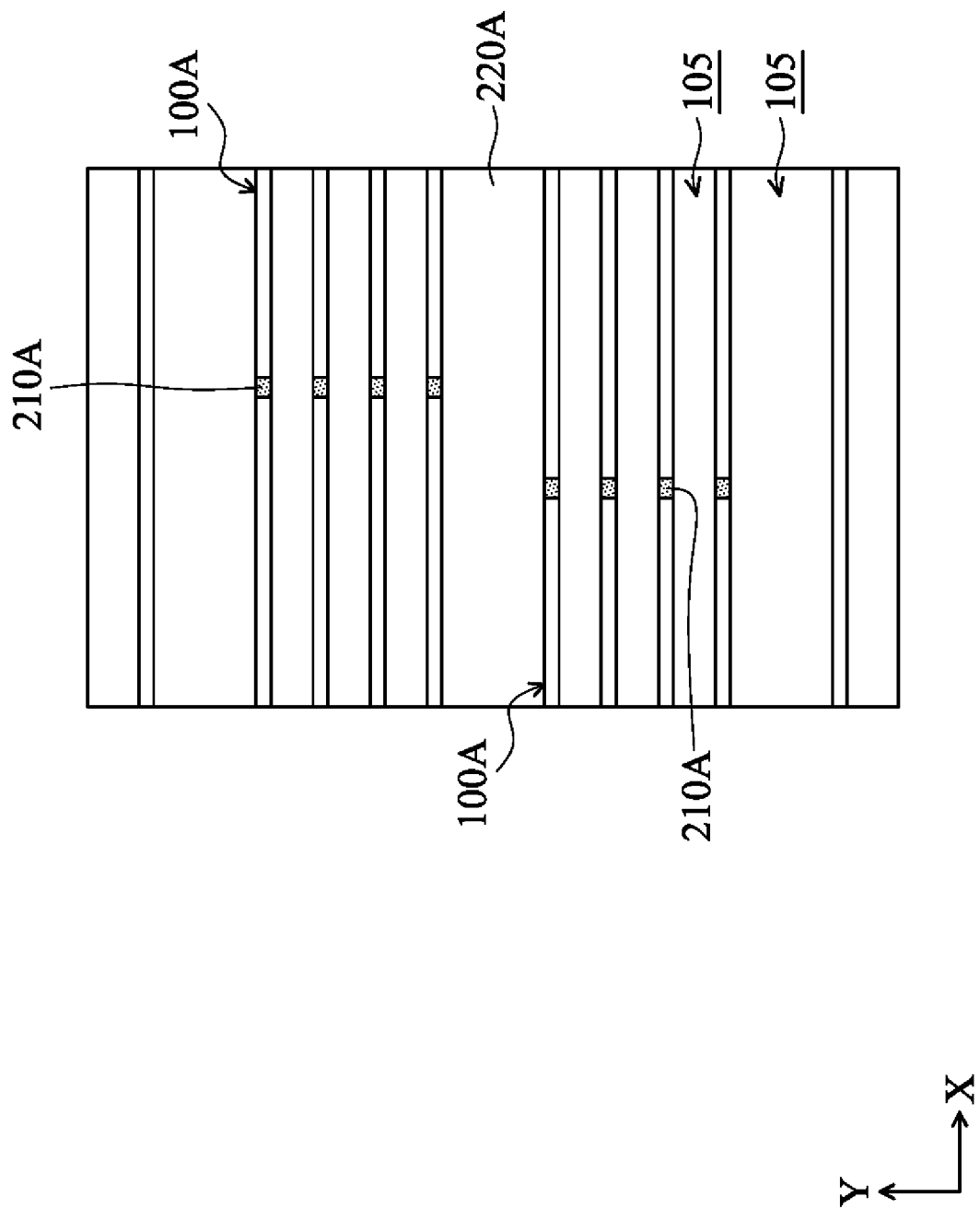

Afterwards, in some embodiments, the exposed mask layer 110 is removed using an etching process (such as a wet etching process), one or more other applicable processes, or a combination thereof. The isolation features 210A may or may not be partially removed during the removal of the mask layer 110. The isolation layer 220 is then etched back to expose upper portions of the fin structures 100A. Some portions of the isolation layer 220 remain in the recesses 105 and envelope lower portions of the fin structures 100A. As a result, the remaining portions of the isolation layer 220 in the recesses 105 form isolation features 220A, as shown in FIGS. 9A and 9B. In some embodiments, the isolation layer 220 is etched such that the isolation layer 220 becomes lower than the fin structures 100A but remains higher than the isolation features 220A.

In accordance with some embodiments, the isolation features 210A is substantially not removed during the partial removal of the isolation layer 220 (i.e., the formation of the isolation features 220A). The material of the isolation features 210A is selected such that the etchant has a sufficiently high etching selectivity of the isolation layer 220 to the isolation features 210A. In other words, the isolation layer 220 is etched much faster than the isolation features 210A. In some embodiments, the etching selectivity to the isolation layer 220 of the isolation features 210A is in a range from about 50 to about 100, but embodiments of the disclosure are not limited thereto.

The isolation features 220A are used to electrically isolate various device elements, which will be formed in and/or over the fin structures 100A. The isolation features 220A surround lower portions of the fin structures 100A. The upper portions of the fin structures 100A protrude from the isolation features 220A. In some embodiments, the bottom of the isolation features 210A is covered by and embedded in the isolation features 220A. The upper portions (or the top) of the isolation features 210A protrude from the isolation features 220A. One of the isolation features 210A is partially sandwiched between two of the isolation features 220A.

The isolation features 220A may be referred to as shallow trench isolation (STI) features. The isolation features 220A may or may not have a multi-layer structure. For example, the isolation features 220A may include the isolation layer 220 and an STI liner (not shown) underlying the isolation layer 220. The STI liner may separate the isolation layer 220 and the isolation features 210A. The STI liner may be used to reduce defects at the interface between the semiconductor substrate 100 and the isolation layer 220. Similarly, the STI liner may also be used to reduce defects at the interface between the fin structures 100A and the isolation layer 220.

Figure 10A:
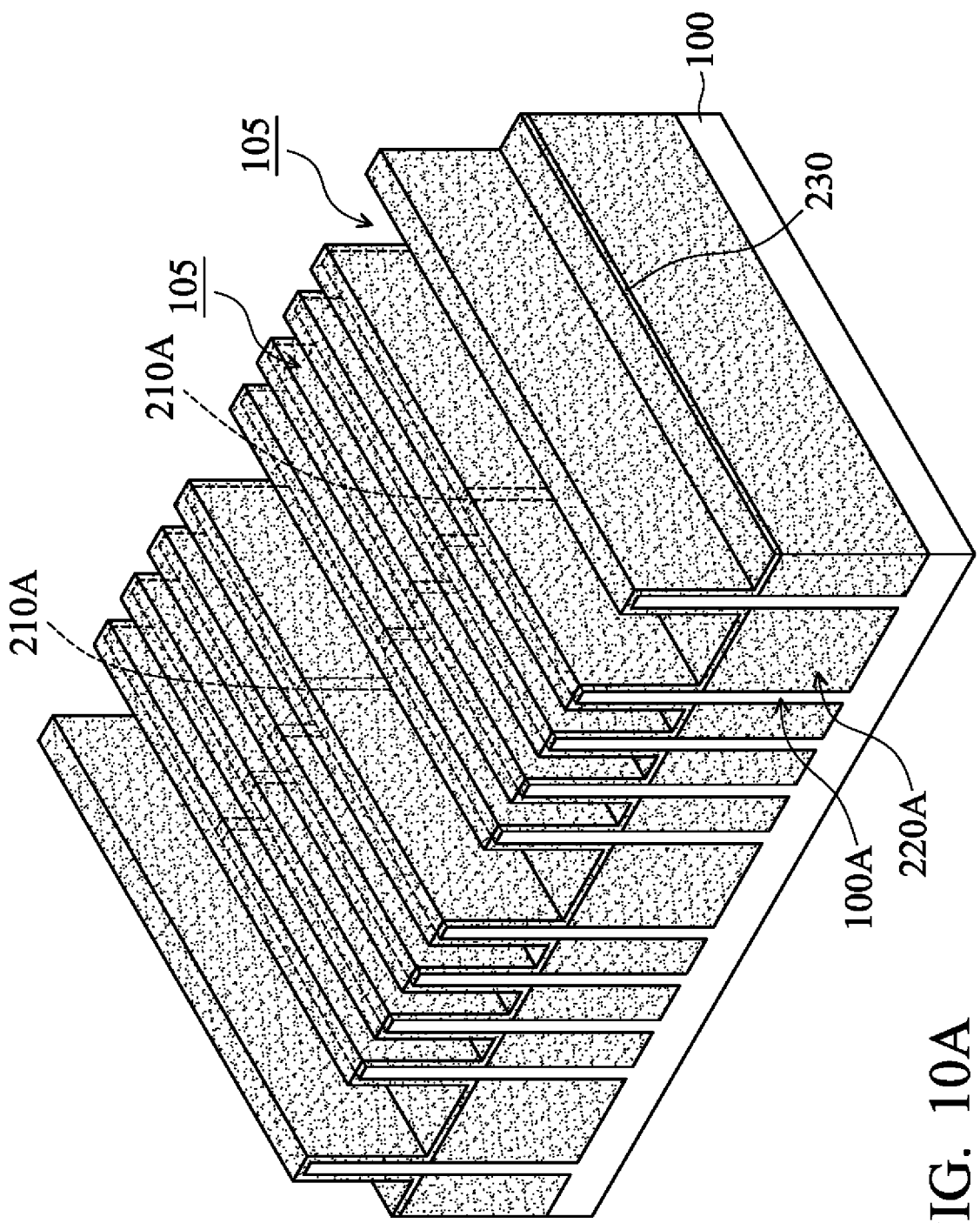
Figure 10B:
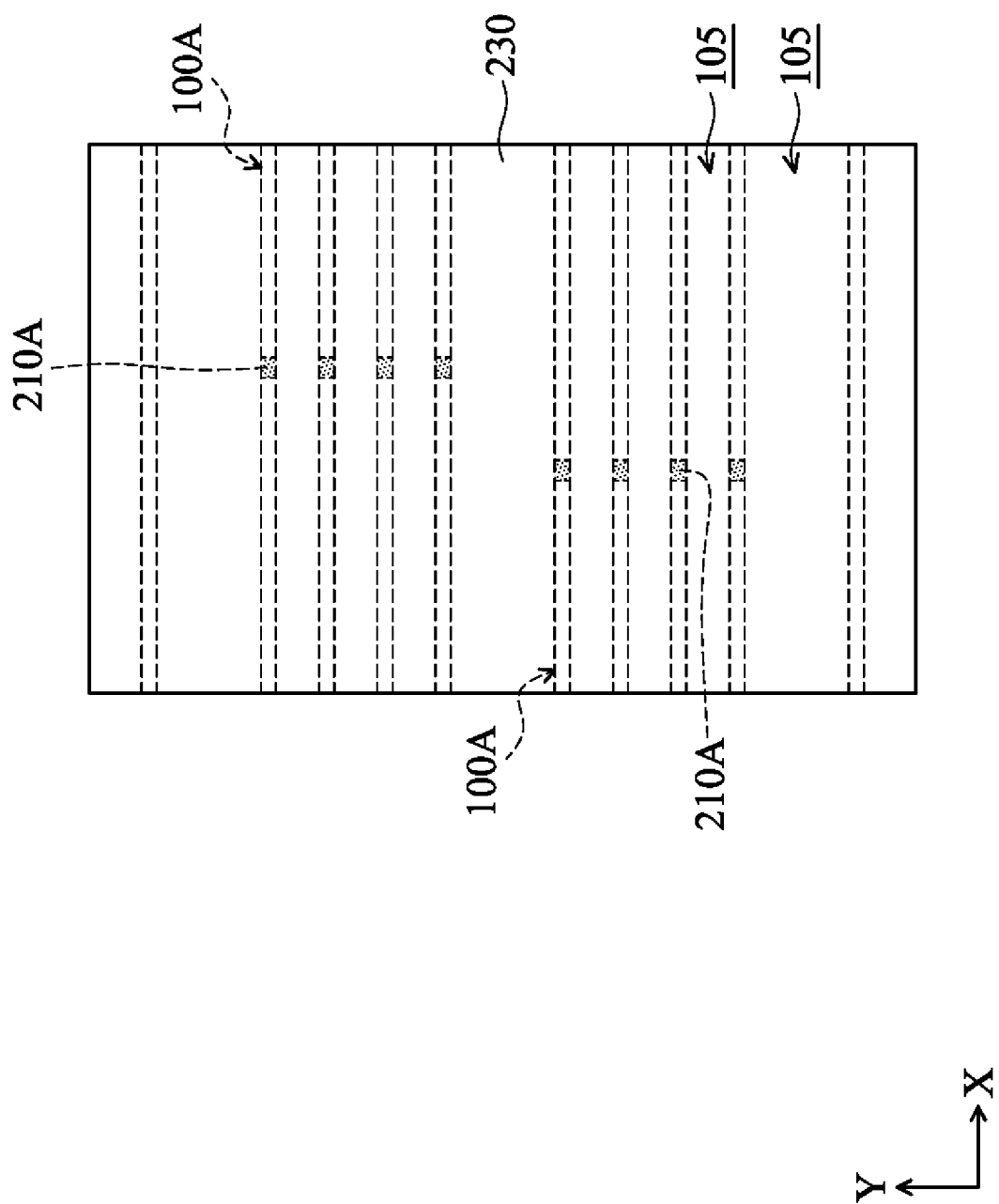

As shown in FIGS. 10A and 10B, a gate dielectric layer 230 is conformally or uniformly deposited over the fin structures 100A, in accordance with some embodiments.

The gate dielectric layer 230 extends over the upper portions of the fin structures 100A and covers the isolation features 210A between the fin structures 100A. In some embodiments, the gate dielectric layer 230 is in direct contact with the isolation features 210A. The gate dielectric layer 230 partially fills the recesses 105 and covers the isolation features 220A. In some embodiments, the gate dielectric layer 230 is in direct contact with the isolation features 220A.

In some embodiments, the gate dielectric layer 230 is a sacrificial or dummy gate dielectric layer and will be replaced with another gate dielectric layer. In some embodiments, the gate dielectric layer 230 is made of a high-K dielectric material. Examples of high-K dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, and a combination thereof. In some embodiments, the gate dielectric layer 230 and the isolation features 210A are made of or include different materials. In some embodiments, the gate dielectric layer 230 is deposited using an ALD process, a CVD process, one or more other applicable processes, or a combination thereof.

Many variations and/or modifications can be made to embodiments of the disclosure. In some other embodiments, before the deposition of the gate dielectric layer 230, an interfacial layer (not shown) is deposited over the fin structures 100A. The interfacial layer may be used to reduce stress between the gate dielectric layer 230 and the fin structures 100A. In some embodiments, the interfacial layer is made of silicon oxide. In some embodiments, the interfacial layer is formed using an ALD process, a thermal oxidation process, one or more other applicable processes, or a combination thereof.

Figure 11A:
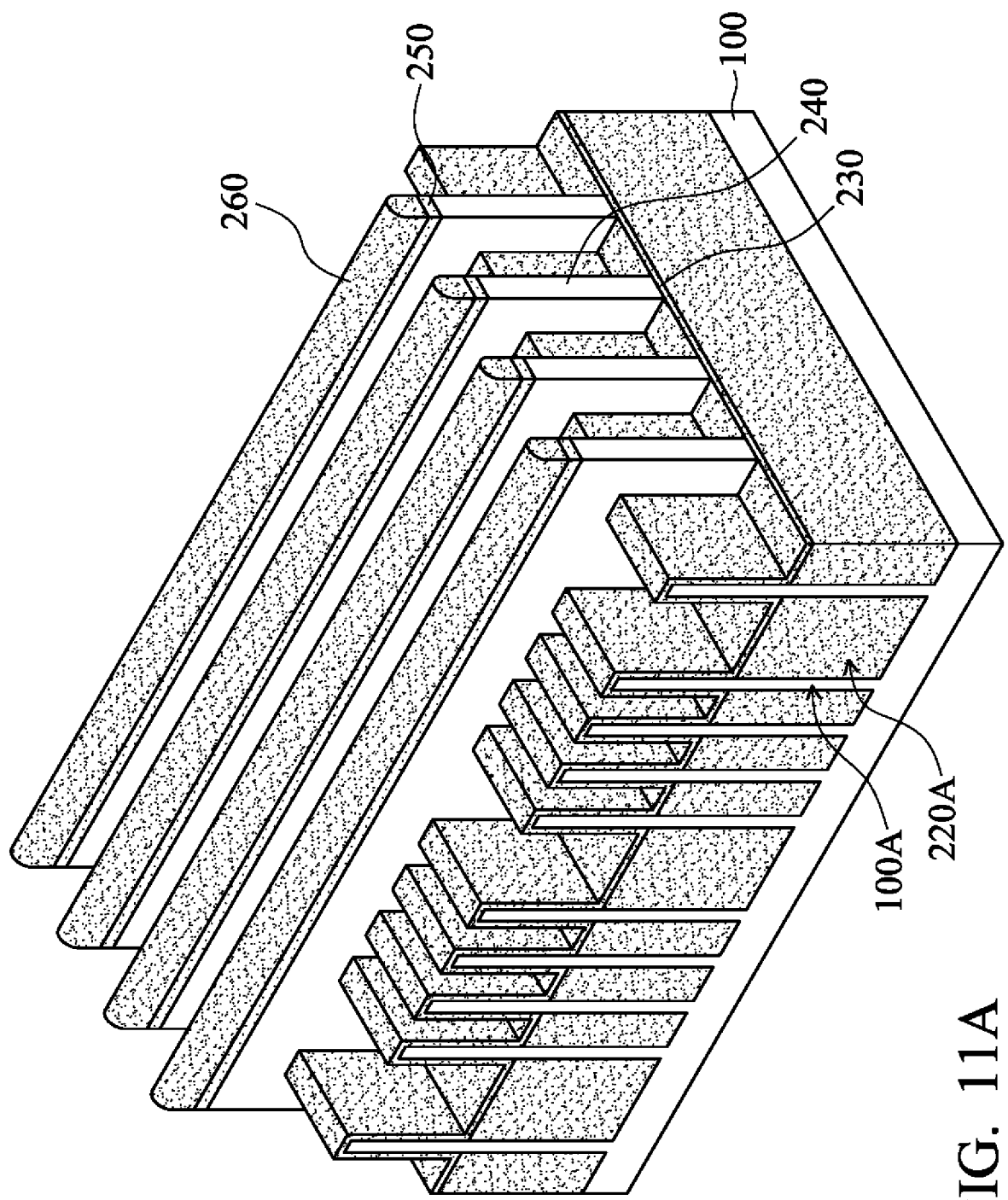

As shown in FIGS. 11A and 11B, multiple gate electrodes 240 are formed over the gate dielectric layer 230, in accordance with some embodiments. The gate electrodes 240 extend along the Y-axis and are arranged in a direction that is substantially parallel to the X-axis. The gate electrodes 240 partially cover the fin structures 100A. One or more of the gate electrodes 240 cover the isolation features 210A, as shown in FIG. 11B. In some embodiments, the gate electrodes 240 surround the fin structures 100A and the isolation features 210A.

In some embodiments, the gate electrodes 240 include polysilicon, a metal material, another suitable conductive material, or a combination thereof. In some embodiments, the gate electrodes 240 are sacrificial or dummy gate electrodes (such as polysilicon gate electrodes) and will be replaced with other gate electrodes such as metal gate electrodes. In some embodiments, the gate electrodes 240 and the gate dielectric layer 230 covered by the gate electrodes 240 together form gate stacks. In some embodiments, the gate stacks are sacrificial or dummy gate stacks and will be replaced with metal gate stacks.

A hard mask structure is formed over the gate dielectric layer 230. Patterned mask layers 250 and 260 of the hard mask structure are shown in FIG. 11A as an example, but embodiments of the disclosure are not limited thereto. The hard mask structure may include less or more layers than those shown in FIG. 11A.

In some embodiments, as shown in FIG. 11B, the mask layer 260 covers and overlaps the isolation features 210A. The mask layer 250, the gate electrodes 240 and the gate dielectric layer 230 also overlaps the isolation features 210A. In some embodiments, the isolation features 210A are directly under the dummy gate stacks.

In some embodiments, the mask layers 250 and 260 are made of or include silicon oxide, silicon nitride, silicon oxynitride, silicon carbide, one or more other suitable materials, or a combination thereof. The mask layers 250 and 260 of the hard mask structure may be used to assist in the patterning process for forming the gate electrodes 240.

For example, in some embodiments, a gate electrode layer and the mask layers 250 and 260 are sequentially deposited by using suitable deposition methods. The suitable deposition methods may include a CVD process, an ALD process, a thermal oxidation process, a PVD process, one or more other applicable processes, or a combination thereof. Afterwards, a photolithography process and an etching process are performed to pattern the deposited mask layers 250 and 260. With the assistance of the patterned mask layers 250 and 260, the gate electrode layer are etched and patterned. As a result, multiple gate electrodes 240 are formed. In some embodiments, the gate dielectric layer 230 serves as an etching stop layer during the formation of the gate electrodes 240.

Figure 12A:
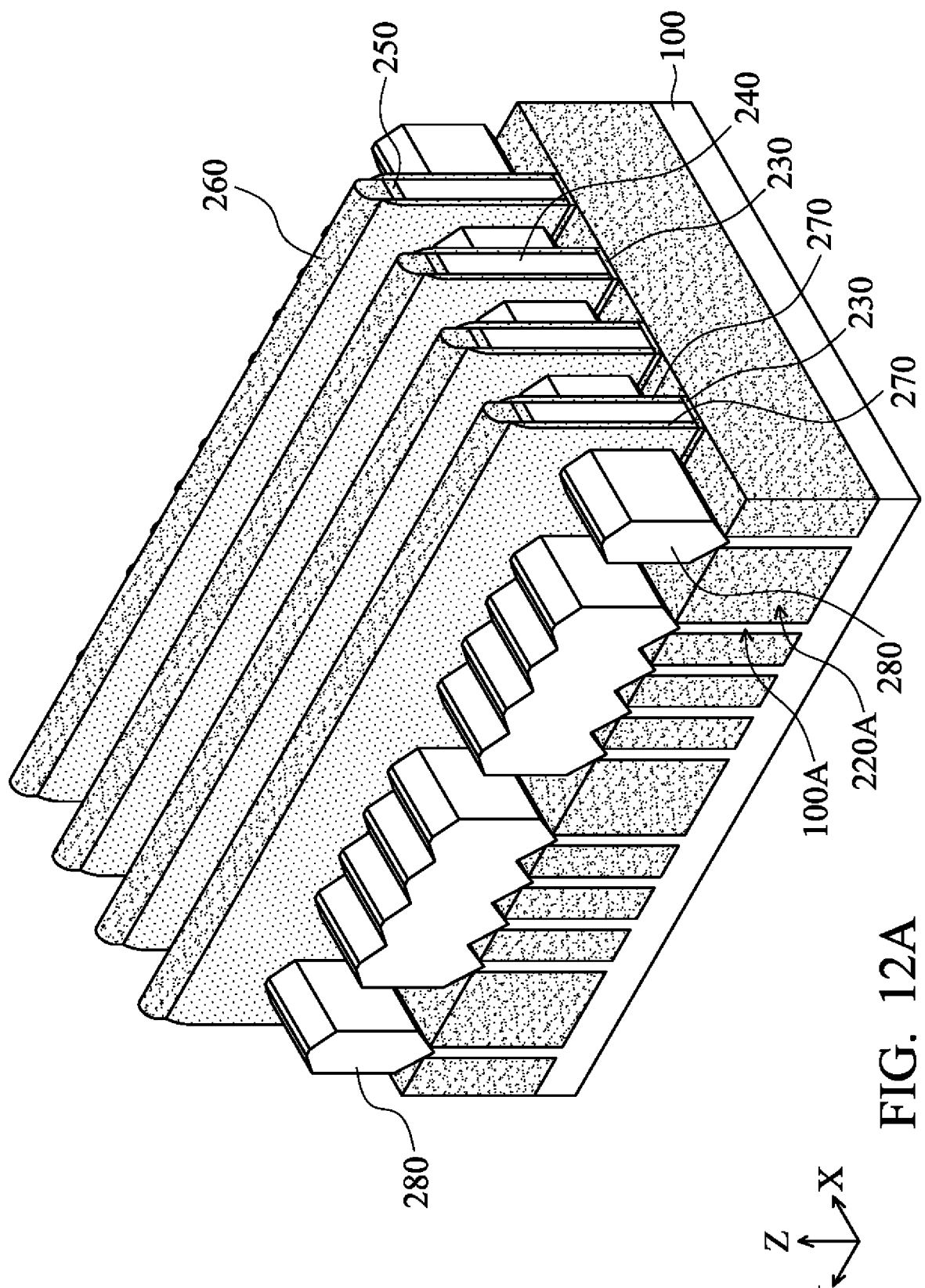
Figure 12B:
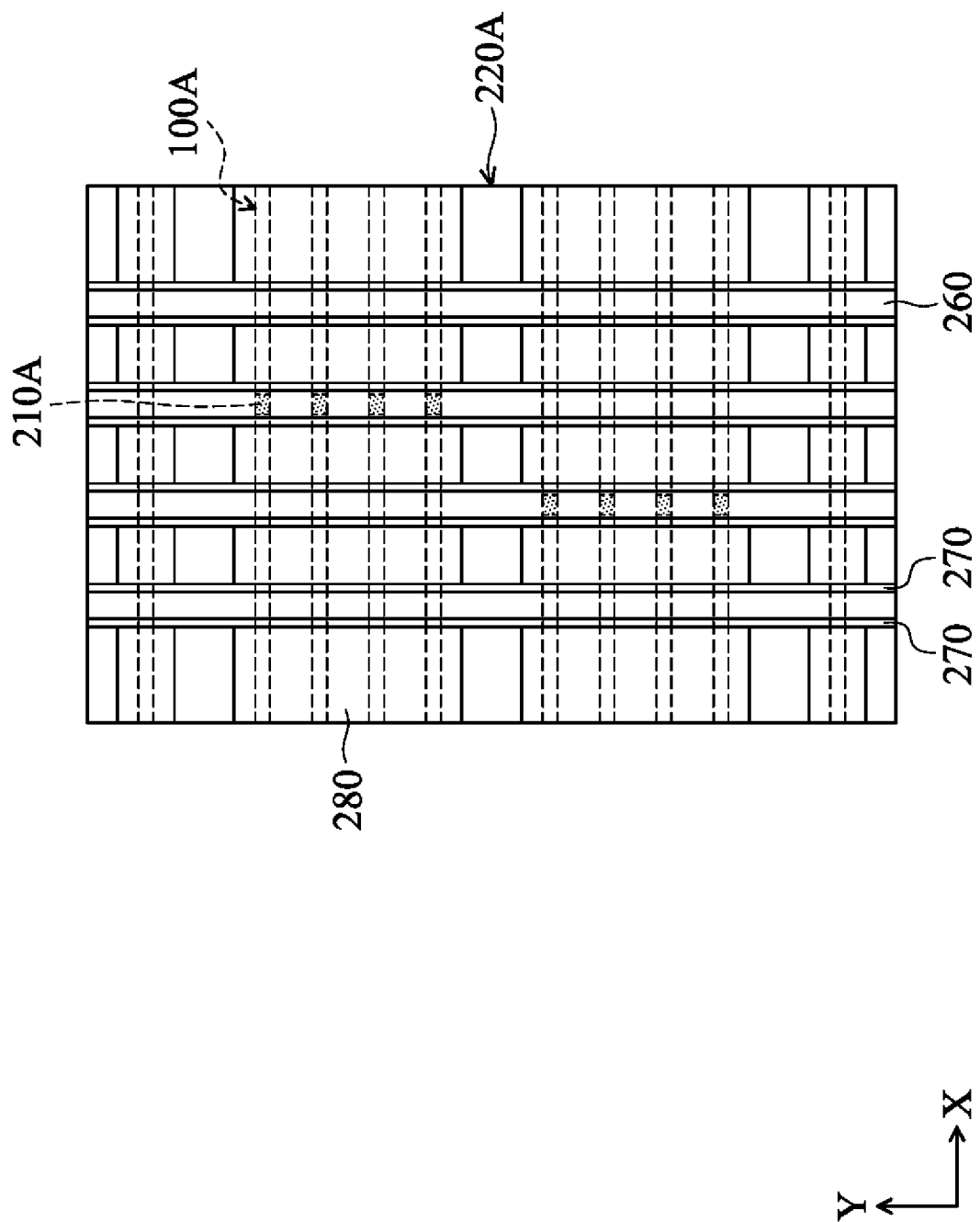

Subsequently, spacer elements 270 are formed over sidewalls of the gate electrodes 240 and the mask layers 250 and 260, as shown in FIGS. 12A and 12B in accordance with some embodiments. Some portions of the gate dielectric layer 230, which are not covered by the gate electrodes 240 and the spacer elements 270, are removed after the formation of the spacer elements 270.

Many variations and/or modifications can be made to embodiments of the disclosure. In some other embodiments, some portions of the gate dielectric layer 230, which are not covered by the gate electrodes 240, are removed before the formation of the spacer elements 270. The spacer elements 270 are then formed over sidewalls of the gate dielectric layer 230, the gate electrodes 240 and the mask layers 250 and 260.

In some embodiments, the spacer elements 270 are made of or include silicon nitride, silicon oxynitride, silicon carbide, silicon oxycarbide, one or more other suitable materials, or a combination thereof. In some embodiments, a spacer layer is deposited using a CVD process, a PVD process, a spin-on process, one or more other applicable processes, or a combination thereof. Afterwards, an etching process, such as an anisotropic etching process, is performed to partially remove the spacer layer. As a result, the remaining portions of the spacer layer form the spacer elements 270.

Although each of the spacer elements 270 shown in figures is a single layer, embodiments of the disclosure are not limited thereto. In some other embodiments, each of the spacer elements 270 has a multi-layer structure. For example, each of the spacer elements 270 may include multiple nitride layers. Many variations and/or modifications can be made to embodiments of the disclosure. In some other embodiments, the spacer elements 270 are not formed.

As shown in FIGS. 12A and 12B, source or drain (S/D) structures 280 are formed over the fin structures 100A, in accordance with some embodiments. The S/D structures 280 may be used to provide stress or strain to channel regions in the fin structures 100A below the gate electrodes 240. As a result, the carrier mobility of the device and device performance are improved.

As shown in FIGS. 12A and 12B, two of the S/D structures 280 are on opposite sides of one of the gate electrodes 240. One of the S/D structures 280 is between two of the gate electrodes 240. In some embodiments, the S/D structures 280 adjoin the fin structures 100A and the spacer elements 270. In some embodiments, some of the S/D structures 280 adjoin each other while some of the S/D structures 280 are separated from each other. However, embodiments of the disclosure are not limited thereto. In some other embodiments, the S/D structures 280 are separated from one another.

In some embodiments, some portions of the fin structures 100A, which are not covered by the gate dielectric layer 230 and the spacer elements 270, are recessed to be lower than the gate dielectric layer 230. Afterwards, the S/D structures 280 are grown over the fin structures 100A that are recessed, as shown in FIG. 12A. In some embodiments, some portions of the fin structures 100A are recessed to be lower than the top surface of the isolation features 220A. As a result, the S/D structures 280, which are grown over the recessed fin structures 100A, extend into the isolation features 220A, as shown in FIG. 12A.

In some embodiments, the depth of the S/D structures 280 in the fin structures 100A is in a range from about 50 nm to about 60 nm, but embodiments of the disclosure are not limited thereto. In some embodiments, the S/D structures 280 are diamond shaped due to a crystalline structure, but embodiments of the disclosure are not limited thereto.

In some embodiments, one or more etching operations are performed to recess and remove the upper portions of the fin structures 100A. It should be noted that embodiments of the disclosure have many variations. In some other embodiments, the fin structures 100A are not partially removed before the growth of the S/D structures 280.

In some embodiments, a semiconductor material (or two or more semiconductor materials) is epitaxially grown over the fin structures 100A that are recessed. The semiconductor material is growing continually to form the S/D structures 280. In some embodiments, the S/D structures 280 are a P-type semiconductor material. For example, the S/D structures 280 may include epitaxially grown silicon or epitaxially grown silicon germanium. The S/D structures 280 are not limited to being a P-type semiconductor material. In some embodiments, the S/D structures 280 are an N-type semiconductor material. The S/D structures 280 may include epitaxially grown silicon, silicon-germanium (SiGe), epitaxially grown phosphorous-doped silicon (SiP), boron-doped silicon germanium (SiGeB) or another suitable epitaxially grown semiconductor material.

In some embodiments, the S/D structures 280 are formed using a selective epitaxy growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g. Si, Ge or SiGe) followed by a solid-phase epitaxial recrystallization (SPER) step, one or more other applicable processes, or a combination thereof. The formation process of the S/D structures 280 may use gaseous and/or liquid precursors. In some embodiments, the S/D structures 280 are grown in-situ in the same process chamber. In other words, the S/D structures 280 are formed using an in-situ epitaxial growth process. In some other embodiments, some of the S/D structures 280 are grown separately.

In some embodiments, the S/D structures 280 are doped with one or more suitable dopants. For example, the S/D structures 280 are Si source or drain features doped with phosphorus (P), arsenic (As), or another suitable dopant. Alternatively, the S/D structures 280 are SiGe source or drain features doped with boron (B) or another suitable dopant. In some embodiments, multiple implantation processes are performed to dope the S/D structures 280.

In some embodiments, the S/D structures 280 are doped in-situ during the growth of the S/D structures 280. In some other embodiments, the S/D structures 280 are not doped during the growth of the S/D structures 280. After the epitaxial growth, the S/D structures 280 are doped in a subsequent process. In some embodiments, the doping is achieved using an ion implantation process, a plasma immersion ion implantation process, a gas and/or solid source diffusion process, one or more other applicable processes, or a combination thereof. In some embodiments, the S/D structures 280 are further exposed to annealing processes to activate the dopants. For example, a rapid thermal annealing process is performed.

Figure 13A:
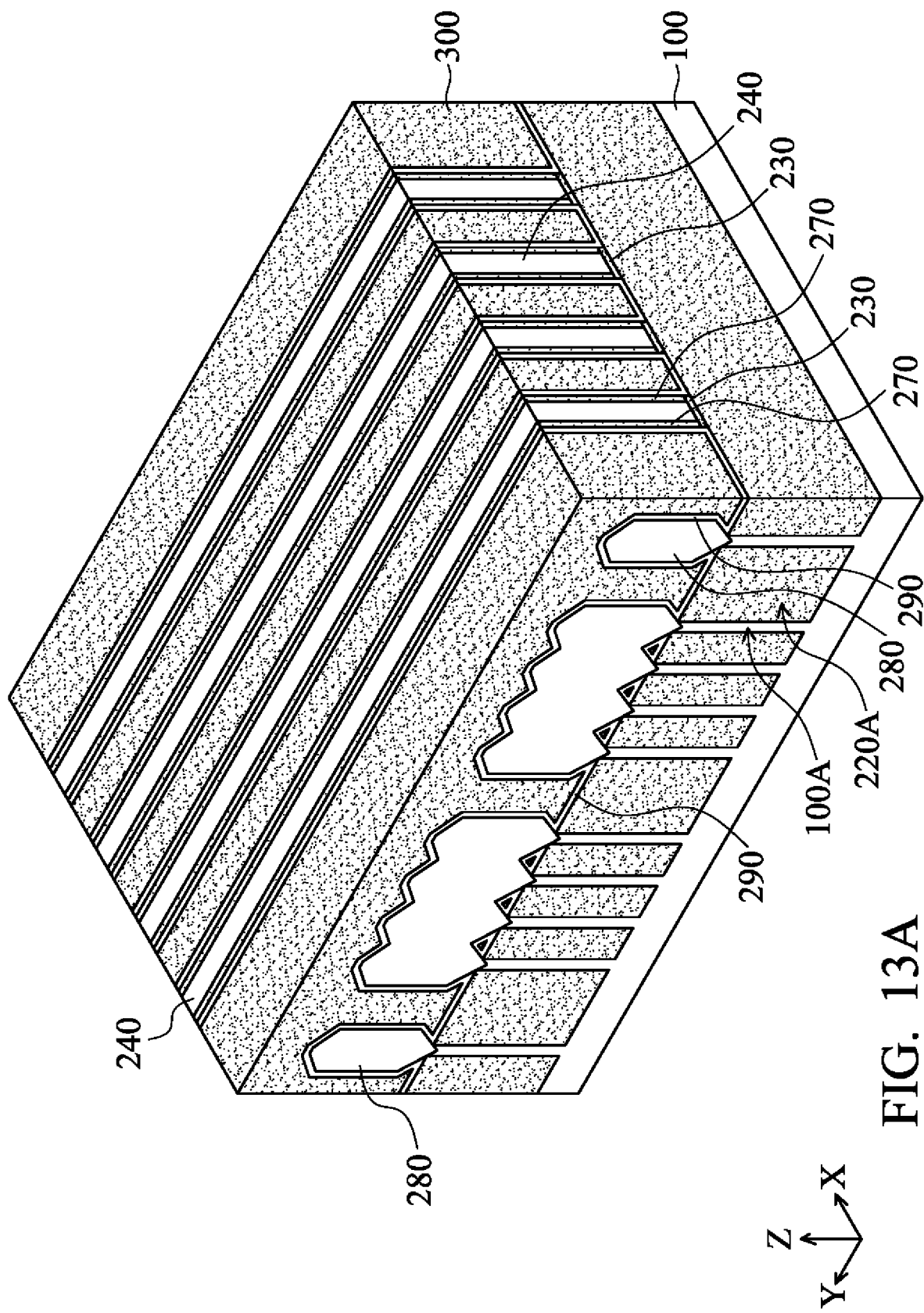
Figure 13B:
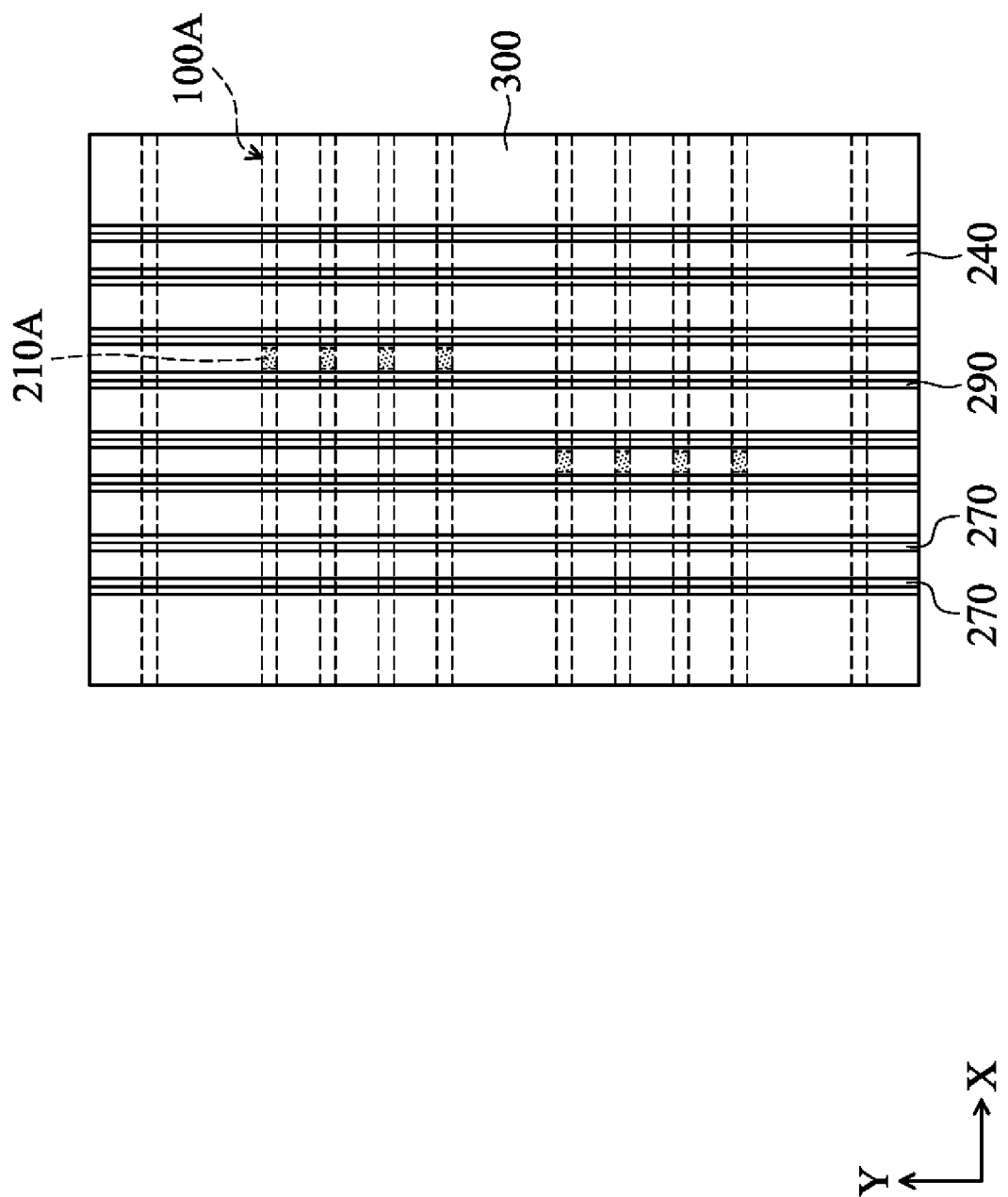

As shown in FIGS. 13A and 13B, a capping layer 290 is deposited over the S/D structures 280, in accordance with some embodiments. The capping layer 290 covers and surrounds the S/D structures 280. In some embodiments, the capping layer 290 is in direct contact with the S/D structures 280. The capping layer 290 may also cover the isolation features 220A, the spacer elements 270, and the mask layers 250 and 260. The capping layer 290 may be used to protect the S/D structures 280 from oxidation during an annealing process. The capping layer 290 may also be used to assist in a subsequent etching process, which will be described in more detail later. The capping layer 290 may be referred to as a contact etch stop layer (CESL).

In some embodiments, the capping layer 290 is made of or includes silicon nitride, silicon oxynitride, silicon carbide, silicon oxycarbide, one or more other suitable materials, or a combination thereof. In some embodiments, the capping layer 290 is deposited using a CVD process, a PVD process, a spin-on process, one or more other applicable processes, or a combination thereof. Many variations and/or modifications can be made to embodiments of the disclosure. In some other embodiments, the capping layer 290 is not formed.

As shown in FIGS. 13A and 13B, a dielectric layer 300 is deposited over the capping layer 290, in accordance with some embodiments. The dielectric layer 300 surrounds the S/D structures 280, the spacer elements 270, the mask layers 250 and 260, the gate electrodes 240 and the isolation features 210A. The dielectric layer 300 may be referred to as an interlayer dielectric (ILD) layer.

In some embodiments, the dielectric layer 300 includes silicon oxide, silicon oxynitride, borosilicate glass (BSG), phosphosilicate glass (PSG), borophosphosilicate glass (BPSG), fluorinated silicate glass (FSG), low-K material, porous dielectric material, another suitable dielectric material, or a combination thereof. The material of the dielectric layer 300 is selected to minimize propagation delays and crosstalk between nearby conductive features. In some embodiments, the dielectric layer 300 is deposited using a CVD process, a spin-on process, an ALD process, a PVD process, one or more other applicable processes, or a combination thereof.

Afterwards, the dielectric layer 300 may be thinned down until the gate electrodes 240 are exposed. As a result, the mask layers 250 and 260 are removed. Some portions of the capping layer 290 over the gate electrodes 240 and the spacer elements 270 are removed. In some embodiments, a planarization process is performed to thin down the dielectric layer 300. The planarization process may include a CMP process, a grinding process, an etching process, one or more other applicable processes, or a combination thereof. In some embodiments, the etching process includes a dry etching process, a wet etching process or another applicable etching process.

Figure 14A:
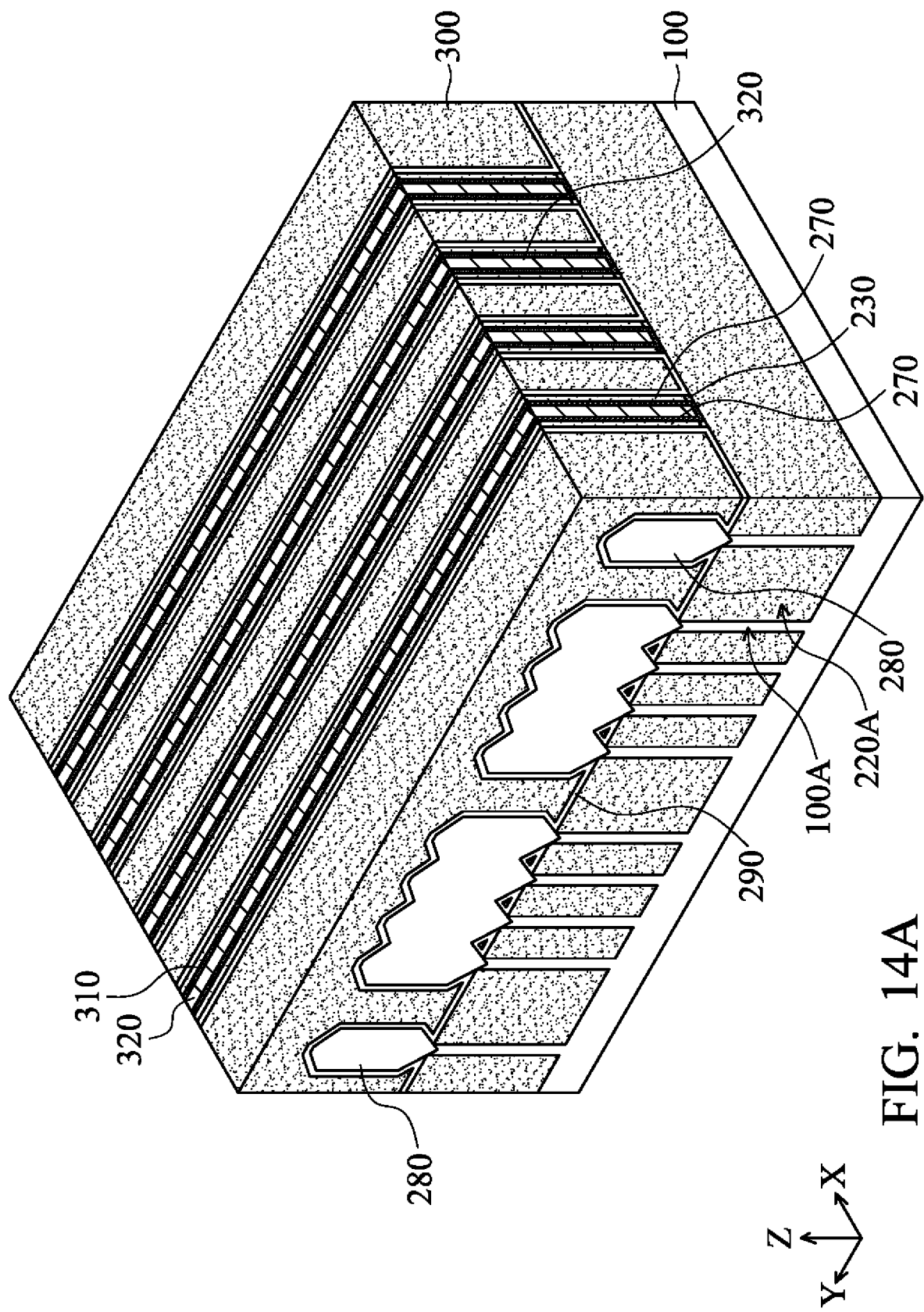

Afterwards, the sacrificial or dummy gate stacks are replaced with metal gate stacks, in accordance with some embodiments. As shown in FIGS. 14A and 14B, the sacrificial gate stacks including the gate dielectric layer 230 and the gate electrodes 240 are replaced with metal gate stacks including a gate dielectric layer 310 and a gate electrode 320. Many variations and/or modifications can be made to embodiments of the disclosure. In some other embodiments, the gate dielectric layer 230 and the gate electrodes 240 form active gate stacks and are not replaced with other gate stacks.

In some embodiments, the gate dielectric layer 230 and the gate electrodes 240 are removed using a wet etching process, a dry etching process, one or more other applicable processes, or a combination thereof. As a result, trenches (not shown) are formed, and the fin structures 100A are partially exposed through the trenches. The exposed portions of the fin structures 100A may serve as channel regions. The isolation features 210A may be also exposed through the trenches.

Afterwards, the gate dielectric layer 310 and the gate electrode 320 fill the trenches and cover the exposed portions of the fin structures 100A and the isolation features 210A. The gate dielectric layer 310 and the gate electrode 320 together form gate stacks. Some of the gate stacks longitudinally overlap the isolation features 210A, as shown in FIG. 14B, and are therefore dummy gate stacks. Some of the gate stacks, which do not overlap the isolation features 210A, are active gate stacks.

In some embodiments, the gate dielectric layer 310 is a high-K dielectric layer. The high-K dielectric layer may be made of hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 310 is deposited using an ALD process, a CVD process, a spin-on process, one or more other applicable processes, or a combination thereof. In some embodiments, a high-temperature annealing operation is performed to reduce or eliminate defects in the gate dielectric layer 310.

Although the gate dielectric layer 310 shown in figures is a single layer, embodiments of the disclosure are not limited thereto. In some other embodiments, the gate dielectric layer 310 has a multi-layer structure. For example, the gate dielectric layer 310 may include an interfacial layer and a high-K dielectric layer overlying the interfacial layer. The interfacial layer may be used to reduce stress between the gate dielectric layer 310 and the fin structures 100A. The interfacial layer may include silicon oxide or another suitable material.

In some embodiments, the gate electrode 320 includes one or more metal gate stacking layers overlying the gate dielectric layer 310. It should be noted that the metal gate stacking layers are not shown in figures for the purpose of simplicity and clarity. Examples of the metal gate stacking layers include a barrier layer, one or more work function layers, a blocking layer, a glue layer, a metal filling layer, one or more other suitable metal gate layers, and combinations thereof. Some of these metal gate stacking layers can be replaced or eliminated for different embodiments. One or more additional metal gate stacking layers can be added in the gate electrode 320 for different embodiments.

More specifically, the barrier layer may be used to interface the gate dielectric layer 310 with the subsequently formed work function layer. The barrier layer may also be used to prevent diffusion between the gate dielectric layer 310 and the work function layer. The blocking layer may be used to prevent the metal filling layer from diffusing or penetrating into the work function layer. The glue layer may be used to increase the adhesion between the work function layer and the metal filling layer so as to prevent the metal filling layer from peeling or delamination. In some embodiments, each of the barrier layer, the blocking layer and the glue layer is made of or includes tantalum nitride, titanium nitride, another suitable material, or a combination thereof. In some embodiments, the metal filling layer is made of or includes tungsten, aluminum, copper, cobalt, another suitable material, or a combination thereof.

The work function layer is used to provide the desired work function for transistors to enhance device performance including improved threshold voltage (Vt). In the embodiments of forming an NMOS transistor, the work function layer can be an N-type metal layer. The N-type metal layer is capable of providing a work function value suitable for the device. The work function value may be substantially equal to or less than about 4.5 eV. The N-type metal layer may include metal, metal carbide, metal nitride, or a combination thereof. For example, the N-type metal layer includes titanium nitride, tantalum, tantalum nitride, one or more other suitable materials, or a combination thereof.

On the other hand, in the embodiments of forming a PMOS transistor, the work function layer can be a P-type metal layer. The P-type metal layer is capable of providing a work function value suitable for the device. The work function value may be substantially equal to or greater than about 4.8 eV. The P-type metal layer may include metal, metal carbide, metal nitride, other suitable materials, or a combination thereof. For example, the P-type metal includes tantalum nitride, tungsten nitride, titanium, titanium nitride, other suitable materials, or a combination thereof.

The work function layer may also be made of hafnium, zirconium, titanium, tantalum, aluminum, metal carbides (e.g., hafnium carbide, zirconium carbide, titanium carbide, aluminum carbide), metal nitrides, ruthenium, palladium, platinum, cobalt, nickel, conductive metal oxides, or a combination thereof. The thickness and/or the compositions of the work function layer may be fine-tuned to adjust the work function level. For example, a titanium nitride layer may be used as a P-type metal layer or an N-type metal layer, depending on the thickness and/or the compositions of the titanium nitride layer.

The metal gate stacking layers are sequentially deposited by using suitable deposition methods. The suitable deposition methods may include an ALD process, a PVD process, an electroplating process, an electroless plating process, a CVD process, one or more other applicable processes, or a combination thereof. In some embodiments, the gate dielectric layer 310 and the metal gate stacking layers fill the trenches, which are formed due to the removal of the gate dielectric layer 230 and the gate electrodes 240. In some embodiments, portions of the gate dielectric layer 310 and the metal gate stacking layers outside of the trenches are removed using a planarization process. The planarization process may include a CMP process, a grinding process, an etching process, one or more other applicable processes, or a combination thereof. The planarization process is performed until the dielectric layer 300 is exposed. As a result, multiple metal gate stacks are formed, as shown in FIGS. 14A and 14B.

Figure 15A:
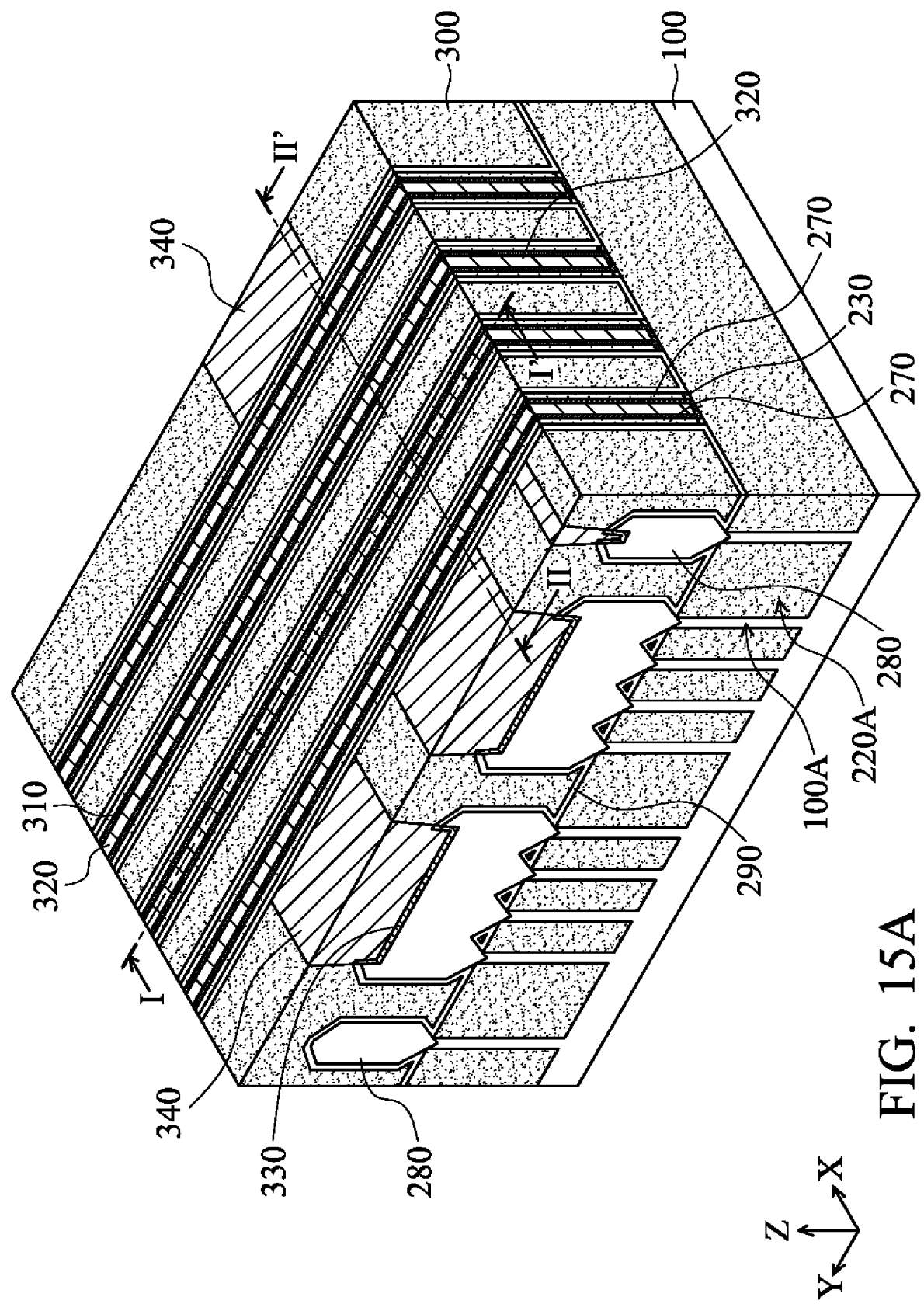
Figure 15B:
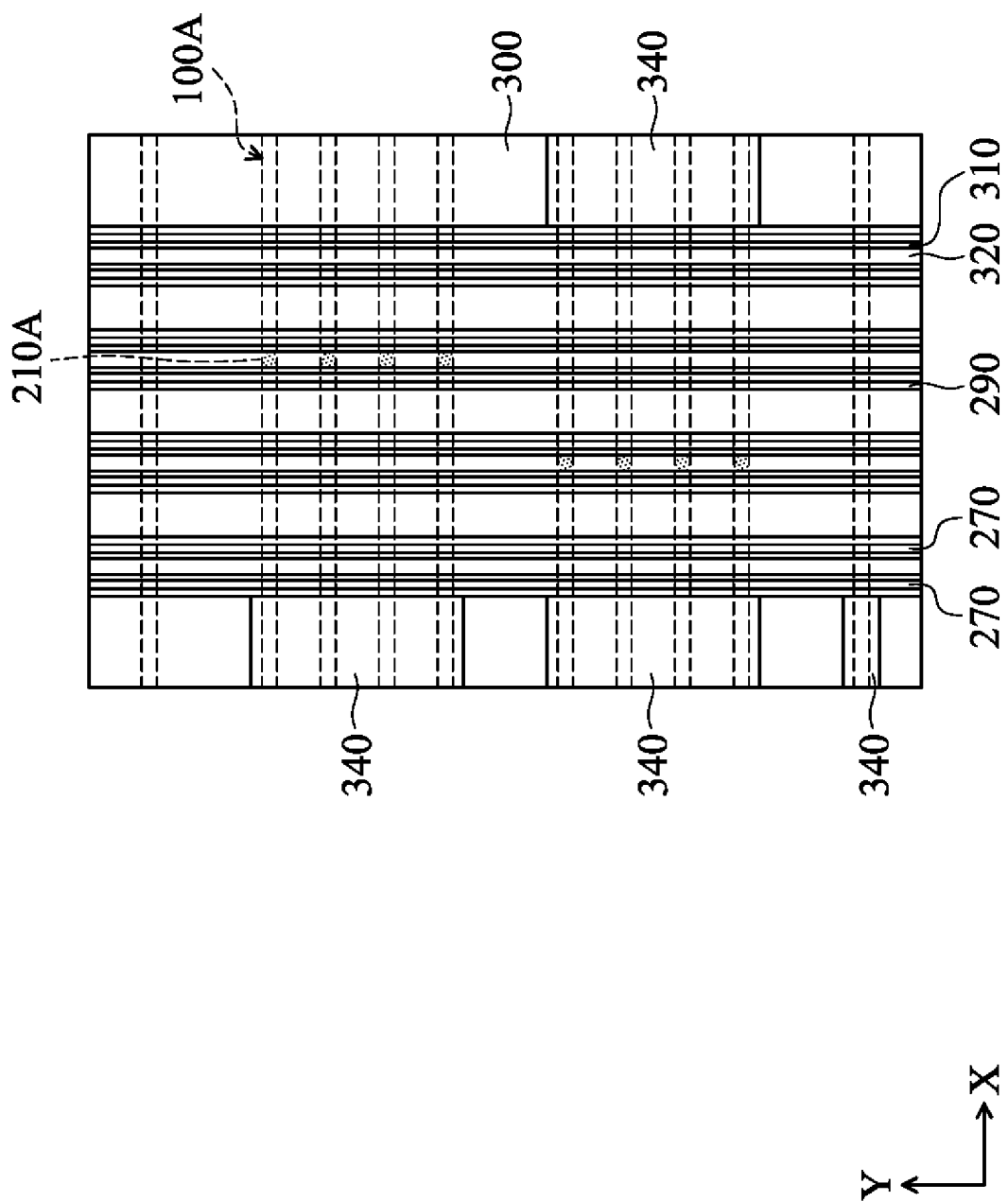

A shown in FIGS. 15A and 15B, multiple conductive features 340 are formed in the dielectric layer 300, in accordance with some embodiments. The conductive features 340 are electrically connected to one or more of the S/D structures 280. The conductive features 340 may be referred to as conductive contacts.

For example, the dielectric layer 300 may be etched to form trenches or openings (not shown). A conductive material is deposited over the dielectric layer 300 to fill the trenches. In some embodiments, the conductive material is made of or includes tungsten, aluminum, copper, gold, platinum, titanium, one or more other suitable materials, or a combination thereof. In some embodiments, the conductive material is deposited using a CVD process, a PVD process, an electroplating process, an electroless plating process, one or more other applicable processes, or a combination thereof.

A planarization process is subsequently used to remove portions of the conductive material outside of the trenches. As a result, the remaining portions of the conductive material in the trenches form the conductive features 340. In some embodiments, the trenches in the dielectric layer 300 extend into the S/D structures 280 such that the resulting conductive features 340 extend into the S/D structures 280, as shown in FIG. 15A. However, embodiments of the disclosure are not limited thereto.

A shown in FIGS. 15A and 15B, a silicide feature 330 is formed between the conductive features 340 and the S/D structures 280, in accordance with some embodiments. The silicide structure 330 may reduce the contact resistance and increase the conductivity of the S/D structures 280.

The silicide structure 330 is made of or includes a metal material. In some embodiments, the silicide structure 330 include is made of or includes titanium silicon, nickel silicon, cobalt silicon, one or more other suitable materials, or a combination thereof. In some embodiments, the metal material is deposited using a PVD process, a CVD process, one or more other applicable processes, or a combination thereof.

In some embodiments, the silicide structure 330 is formed using a self-aligned silicidation (salicidation) process before the formation of the conductive features 340. For example, the metal material is conformally deposited over the S/D structures 280. Afterwards, an annealing process may be performed to cause the diffusion of the metal material into the S/D structures 280. As a result, the silicide structure 330 is formed at the exposed surfaces of the S/D structures 280. After the annealing process, a cleaning treatment may be applied to remove remaining and undiffused portions of the metal material. The resulting silicide structure 330 is self-aligned with the exposed surfaces of the S/D structures 280.

Many variations and/or modifications can be made to embodiments of the disclosure. In some other embodiments, the silicide structure 330 is not formed.

Subsequently, various features will be formed over the dielectric layer 300 and the conductive features 340 to continue the formation of the interconnection structure. Some of the various features are electrically connected to the conductive features 340 and the gate electrode 320. These features may include conductive contacts, interconnection layers, conductive vias, and other suitable features.

Figure 16:
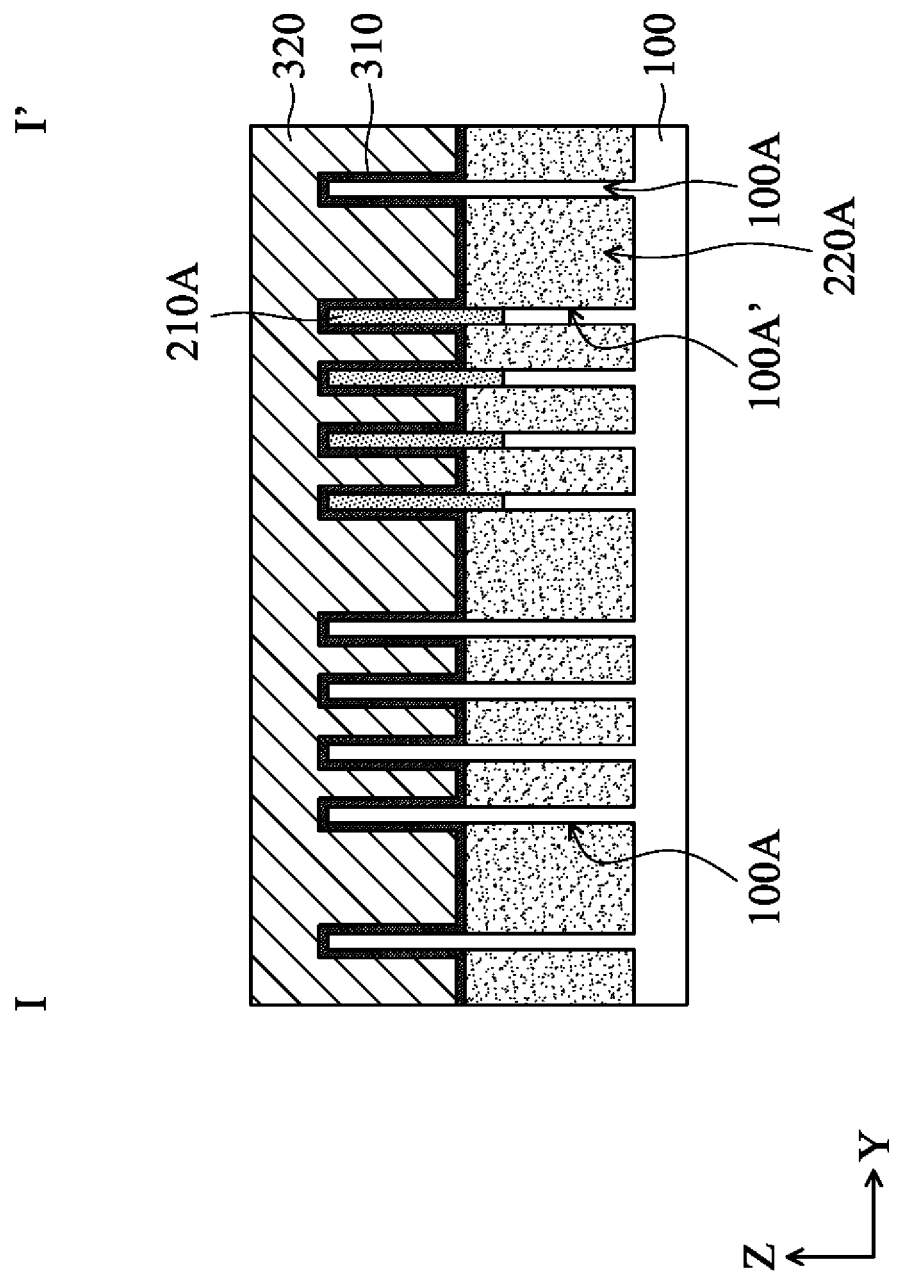
FIG. 16 is a cross-sectional view of a semiconductor device structure, in accordance with some embodiments.

FIG. 16 is a cross-sectional view of a semiconductor device structure, in accordance with some embodiments. In some embodiments, FIG. 16 is a cross-sectional view taken along line I-I' shown in FIG. 15A. Line I-I' may be substantially parallel to the Y-axis. A shown in FIG. 16, the isolation features 220A are over the semiconductor substrate 100. One or more fin structures (such as lower portions 100A' of some of the fin structures 100A) is in the isolation features 220A. The gate dielectric layer 310 and the gate electrode 320 together form dummy gate stacks over the lower portions 100A' and the isolation features 220A.

A shown in FIG. 16, the isolation features 210A are between the lower portions 100A' and the dummy gate stacks, in accordance with some embodiments. In some embodiments, the isolation features 210A are partially surrounded by the gate dielectric layer 310 and the gate electrode 320. The bottom of the isolation features 210A is embedded in the isolation features 220A and partially surrounded by the isolation features 220A.

In some embodiments, the isolation features 210A adjoin the lower portions 100A', the isolation features 220A and the gate dielectric layer 310. In some embodiments, a portion of the isolation features 210A is sandwiched between the lower portions 100A' and the gate dielectric layer 310. In some embodiments, the interface between the isolation features 220A and the gate dielectric layer 310 is closer to the bottom of the isolation features 210A than the top of the isolation features 210A. In some embodiments, the thickness of the isolation features 210A is substantially equal to the thickness of the lower portions 100A' of the fin structures 100A, as shown in FIG. 16. In some embodiments, the profile of the isolation features 210A in the Y-Z plane is rectangular, as shown in FIG. 16, but embodiments of the disclosure are not limited thereto.

Figure 17:
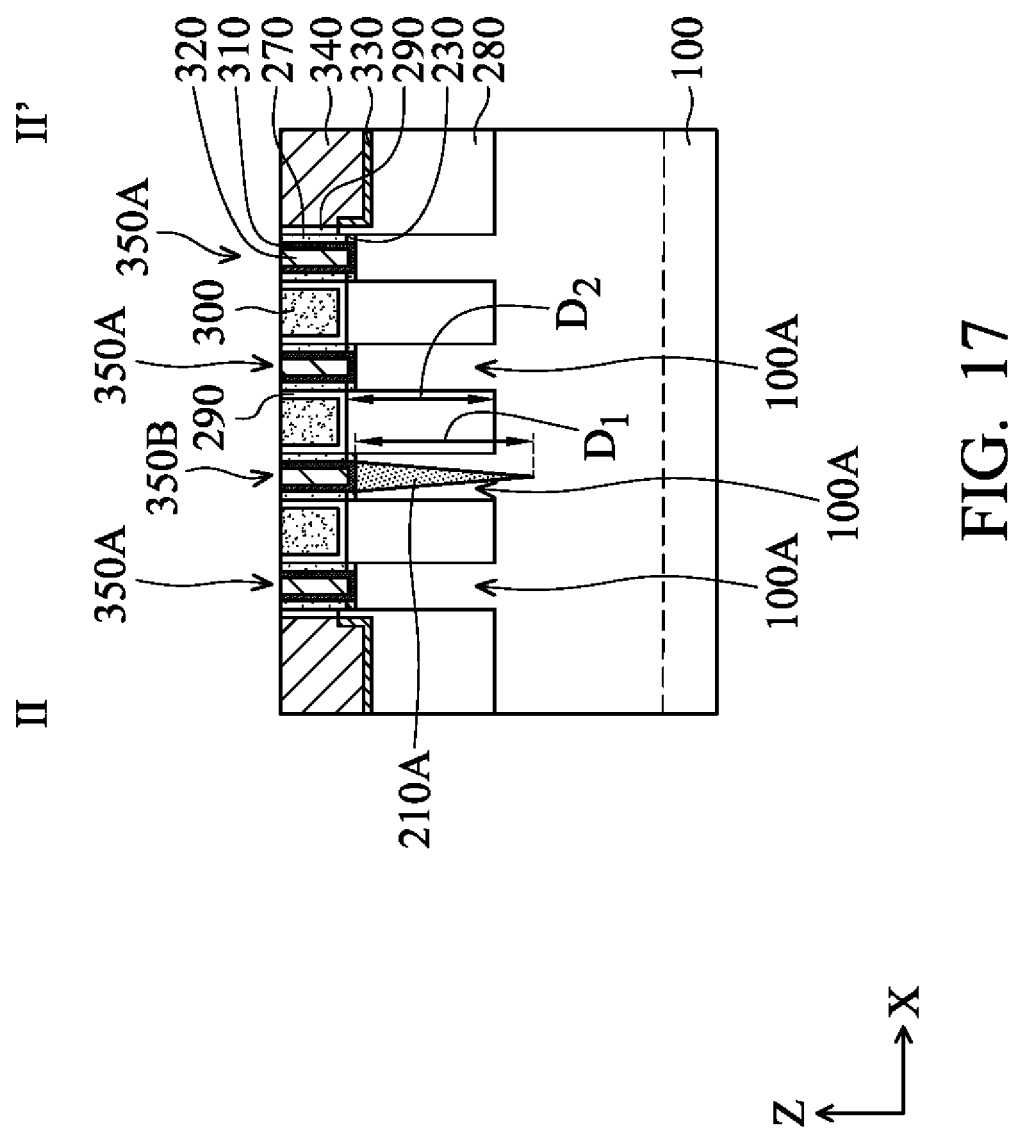
FIG. 17 is a cross-sectional view of a semiconductor device structure, in accordance with some embodiments.

FIG. 17 is a cross-sectional view of a semiconductor device structure, in accordance with some embodiments. In some embodiments, FIG. 17 is a cross-sectional view taken along line II-II' shown in FIG. 15A. Line II-II' may be substantially parallel to the X-axis. Line II-II' may extend along one of the fin structures 100A.

A shown in FIG. 17, multiple active gate stacks 350A and a dummy gate stack 350B are over a fin structure 100A, in accordance with some embodiments. The active gate stacks 350A are on two opposite sides of the dummy gate stack 350B. Spacer elements 270 are over sidewalls of the active gate stacks 350A and the dummy gate stack 350B.

A shown in FIG. 17, an isolation feature 210A is embedded in the fin structure 100A so as to isolate the active gate stacks 350A from each other. The isolation feature 210A is below the active gate stacks 350A, the dummy gate stack 350B and the spacer elements 270. In some embodiments, the isolation feature 210A is directly under the dummy gate stack 350B. The isolation feature 210A extends into the fin structure 100A from the bottom of the dummy gate stack 350B. In some embodiments, the isolation feature 210A is in direct contact with the bottom of the dummy gate stack 350B. In some embodiments, a gate dielectric layer 310 of the dummy gate stack 350B is sandwiched between a gate electrode 320 of the dummy gate stack 350B and the isolation feature 210A.

In some embodiments, there is only one dummy gate stack 350B between two active gate stacks 350A. There is only one isolation feature 210A between two active gate stacks 350A. The isolation feature 210A under single dummy gate stack 350B provides sufficient isolation between the active gate stacks 350A so as to define various devices in multiple active regions. Accordingly, the semiconductor device structure has a decreased area. The size of the semiconductor device structure can be reduced even further to meet requirements.

As shown in FIG. 17, the isolation feature 210A is separated from the S/D structures 280 through portions of the fin structure 100A. Portions of the fin structure 100A are sandwiched between the isolation feature 210A and the S/D structures 280. The isolation feature 210A is spaced apart from the capping layer 290. The isolation feature 210A is separated from the capping layer 290 and the dielectric layer 300 by the dummy gate stack 350B. In some embodiments, a portion of the gate dielectric layer 310 is sandwiched between the isolation feature 210A and the gate electrode 320. As shown in FIG. 17, the continuous capping layer 290 separates the dielectric layer 300 from a spacer element 270 that is over the sidewall of the dummy gate stack 350B and from a spacer element 270 that is over the sidewall of one of the active gate stacks 350A.

A shown in FIG. 17, the isolation feature 210A extends deeper into the fin structure 100A than the S/D structures 280. As a result, the bottom of the isolation feature 210A, which may be a tip, is lower than the bottom of the S/D structures 280. In some embodiments, the depth $D_1$ of the isolation feature 210A in the fin structure 100A is in a range from about 70 nm to about 150 nm. In some embodiments, the depth $D_2$ of the S/D structures 280 is in a range from about 50 nm to about 60 nm. In some embodiments, a ratio of the depth $D_1$ to the depth $D_2$ is in a range from about 1.1 to about 2.0. The depth $D_1$ is greater than the depth $D_2$ so as to eliminate or avoid current leakage between various devices.

In some embodiments, the width $W_3$ of the isolation feature 210A (shown in FIGS. 7B and 7C) is substantially equal to or less than the width of the dummy gate stack 350B. The width $W_3$ may be less than the width of a portion of the fin structure 100A between the S/D structures 280, as shown in FIG. 17. The top surface of the isolation feature 210A may be narrower than the distance or pitch between two of the S/D structures 280, as shown in FIG. 17.

The isolation feature 210A may be substantially aligned to the dummy gate stack 350B including the gate dielectric layer 310 and the gate electrode 320. The isolation feature 210A may not overlap the spacer elements 270. It can be ensured that the formation and/or the profile of the S/D structures 280 are not affected by the isolation feature 210A.

For example, in some cases, the width $W_3$ of the isolation feature 210A should be substantially equal to or less than about 12 nm. If the width $W_3$ is greater than about 12 nm, the isolation feature 210A may affect the formation and the profile of the S/D structures 280.

Although FIG. 17 shows that the isolation feature 210A is substantially aligned to the dummy gate stack 350B, embodiments of the disclosure are not limited thereto. The isolation feature 210A may shift and be misaligned to the dummy gate stack 350B.

Figure 18:
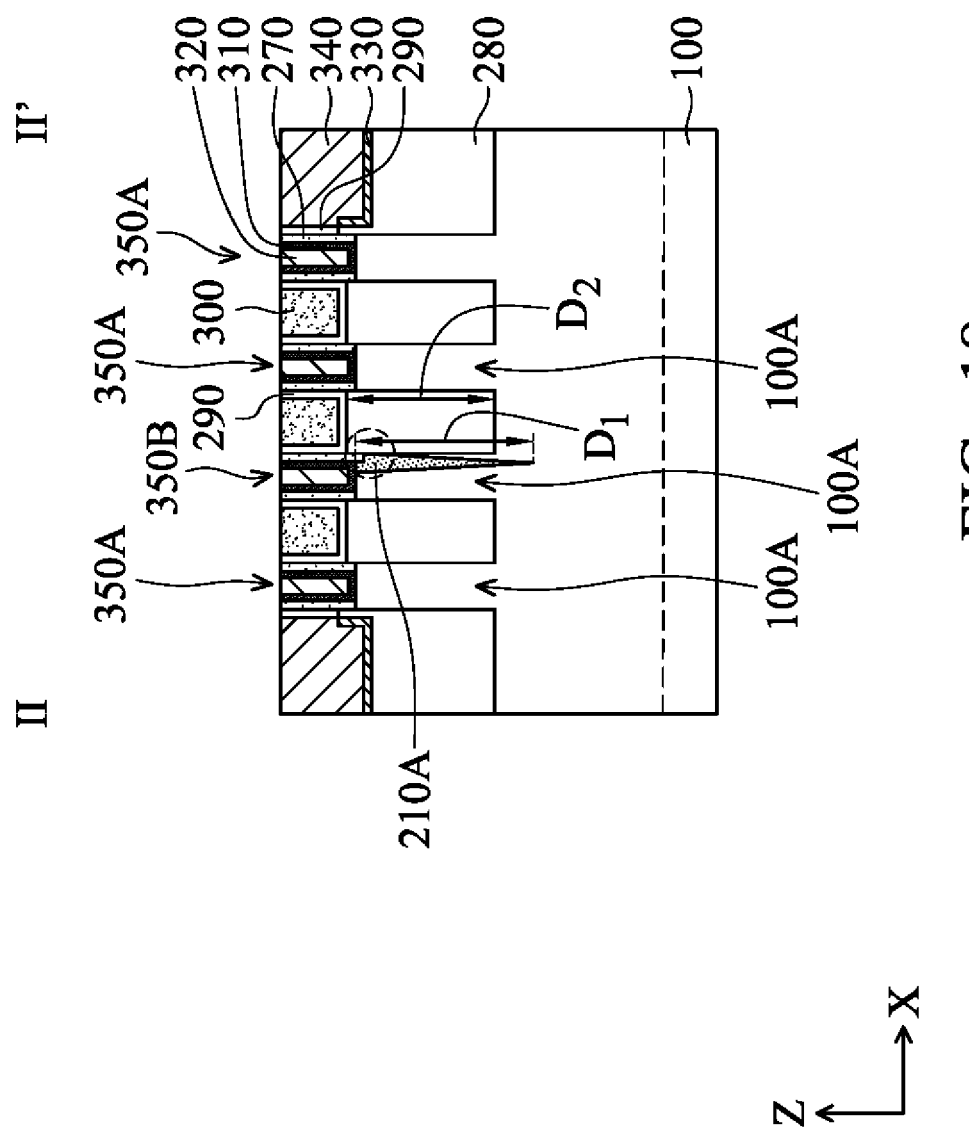
FIG. 18 is a cross-sectional view of a semiconductor device structure, in accordance with some embodiments.

FIG. 18 is a cross-sectional view of a semiconductor device structure, in accordance with some embodiments. In some embodiments, FIG. 18 is a cross-sectional view taken along line II-II' shown in FIG. 15A. The structure shown in FIG. 18 is similar to that shown in FIG. 17. In some embodiments, the materials and/or formation methods of the semiconductor device structure shown in FIGS. 15A and 15B can also be applied in the embodiments illustrated in FIG. 18, and are therefore not repeated.

As shown in FIG. 18, the isolation feature 210A is not precisely aligned to the dummy gate stack 350B. The isolation feature 210A longitudinally overlaps not only the gate dielectric layer 310 and the gate electrode 320 but also one of the spacer elements 270.

In some embodiments, the isolation feature 210A is in direct contact with the dummy gate stack 350B, one of the spacer elements 270, and one of the S/D structures 280. In some embodiments, one of the spacer elements 270 extends downwardly in the fin structure 100A to adjoin the isolation feature 210A, as indicated by a dashed circle. As a result, one of the spacer elements 270 has a bottom lower than the bottom of other spacer elements 270 and the bottom of the gate dielectric layer 310. This spacer element 270 extends between the isolation feature 210A and one of the S/D structures 280, as shown in FIG. 18. The isolation feature 210A may adjoin the bottom and a sidewall of the spacer elements 270.

In some cases, the position of the opening 200 (shown in FIGS. 5A, 5B and 5C) may shift in a way that is not desired. As a result, the isolation feature 210A formed in the opening 200 may be misaligned to the dummy gate stack 350B and have an exposed portion that is not covered by the dummy gate stack 350B. The exposed portion of the isolation feature 210A may adjoin the S/D structures 280. During one or more etching processes, the exposed portion of the isolation feature 210A may be partially etched and then removed.

In some embodiments, the space, which is created due to the partial removal of the exposed portion of the isolation feature 210A, is filled with the spacer elements 270. Accordingly, one or more of the spacer elements 270 are formed not only over the sidewalls of the dummy gate stack 350B but also below the dummy gate stack 350B. In some embodiments, the isolation feature 210A and the spacer element 270 together provide electrical isolation between the active gate stacks 350A. The possible shift of the openings 200 does not weaken the isolation between the active gate stacks 350A.

According to the aforementioned embodiments, the isolation features 210A, which are used to isolate the active gate stacks 350A from each other, are formed before the formation of the isolation feature 220A, the dummy gate stack 350B and the active gate stacks 350A. The isolation features 210A are not formed after the formation of an ILD layer (such as the dielectric layer 300). The fabrication process of the isolation features 210A does not include the removal of gate stacks, fin structures and/or other features. As a result, the fabrication process of the isolation features 210A becomes simple. The S/D structures 280 can be prevented from being damaged during the formation of the isolation features 210A (such as etching processes). ILD loss issues (for example, top portions of the ILD layer may be removed due to the etching processes) are also avoided. Therefore, embodiments of the disclosure provide simpler processes for forming semiconductor device structures having improved reliability.

Embodiments of the disclosure can be applied to not only a semiconductor device structure with N-type or P-type transistors but also a semiconductor device structure with complementary transistors or other suitable devices. Embodiments of the disclosure are not limited and may be applied to fabrication processes for any suitable technology generation. Various technology generations include a 16 nm node, a 10 nm node, a 7 nm node, a 5 nm node, a 3 nm node, or another suitable node.

Embodiments of the disclosure form a semiconductor device structure with a fin structure and active gate stacks over the fin structure. The semiconductor device structure includes a dummy gate stack over the fin structure. The dummy gate stack is between two of the active gate stacks. The semiconductor device structure also includes an isolation feature used to isolate the active gate stacks. The isolation feature is embedded in the fin structure and under the dummy gate stack. Since there is only one dummy gate stack between two of the active gate stacks, the area of the semiconductor device structure can be reduced even further to meet requirements.

Furthermore, the isolation feature embedded in the fin structure is formed before the formation of the dummy gate stack and the active gate stacks. As a result, the fabrication process of the isolation feature becomes simple. It can also be ensured that S/D structures on opposite sides of the active gate stacks are not damaged during the formation of the isolation feature and ILD loss issues are not induced. Therefore, the reliability of the semiconductor device structure is significantly enhanced.

In accordance with some embodiments, a semiconductor device structure is provided. The semiconductor device structure includes a fin structure over a semiconductor substrate. The semiconductor device structure also includes active gate stacks over the fin structure. The semiconductor device structure further includes a dummy gate stack over the fin structure. The dummy gate stack is between the active gate stacks. In addition, the semiconductor device structure includes spacer elements over sidewalls of the dummy gate stack and the active gate stacks. The semiconductor device structure also includes an isolation feature below the dummy gate stack, the active gate stacks and the spacer elements. The isolation feature extends into the fin structure from the bottom of the dummy gate stack such that the isolation feature is surrounded by the fin structure.

In accordance with some embodiments, a semiconductor device structure is provided. The semiconductor device structure includes a first isolation feature over a semiconductor substrate. The semiconductor device structure also includes a fin structure in the first isolation feature. The semiconductor device structure further includes a dummy gate stack over the fin structure and the first isolation feature. In addition, the semiconductor device structure includes a second isolation feature between the fin structure and the dummy gate stack. The second isolation feature is surrounded by the dummy gate stack and the first isolation feature.

In accordance with some embodiments, a method for forming a semiconductor device structure is provided. The method includes forming a fin structure over a semiconductor substrate. The method also includes forming a first isolation feature in the fin structure. The method further includes forming a second isolation feature over the semiconductor substrate after the formation of the first isolation feature. The fin structure and the first isolation feature protrude from the second isolation feature. In addition, the method includes forming gate stacks over the second isolation feature. The gate stacks surround the fin structure and the first isolation feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a fin structure over a semiconductor substrate;
    active gate stacks over covering a top and sidewalls of the fin structure, wherein each of the active gate stacks comprises a gate electrode with a first width;
    a dummy gate stack over covering a top and sidewalls the fin structure, wherein the dummy gate stack is between the active gate stacks, wherein the dummy gate stack comprises a gate electrode with a second width that is equal to the first width;
    a source or drain (S/D) structure in the fin structure;
    a dielectric layer between the dummy gate stack and at least one of the active gate stacks;
    spacer elements over sidewalls of the dummy gate stack and the active gate stacks;
    a continuous capping layer separating the dielectric layer from the spacer element over the sidewall of the dummy gate stack and from the spacer element over the sidewall of the at least one of the active gate stacks; and
    an isolation feature below the dummy gate stack, the active gate stacks and the spacer elements, wherein the isolation feature extends into the fin structure from a bottom of the dummy gate stack such that the isolation feature is surrounded by the fin structure, wherein only one side of the isolation feature is in direct contact with the S/D structure, and wherein the isolation feature has two opposing sloped sidewalls that intersect each other in the fin structure.

2. The semiconductor device structure as claimed in claim 1, wherein the isolation feature is in contact with the bottom of the dummy gate stack.

3. The semiconductor device structure as claimed in claim 1, wherein the dummy gate stack further comprises a gate dielectric layer, and a portion of the gate dielectric layer of the dummy gate stack is sandwiched between the gate electrode of the dummy gate stack and the isolation feature.

4. The semiconductor device structure as claimed in claim 1, wherein the isolation feature gradually shrinks along a direction from the fin structure towards the semiconductor substrate, and a bottom of the isolation feature is a tip in the fin structure.

5. The semiconductor device structure as claimed in claim 1,
    wherein the isolation feature is separated from the dielectric layer by the dummy gate stack.

6. The semiconductor device structure as claimed in claim 1, wherein the isolation feature adjoins the dummy gate stack and a bottom of one of the spacer elements.

7. The semiconductor device structure as claimed in claim 1,
    wherein a bottom portion of the one of the spacer elements extends into the fin structure and between the isolation feature and the S/D structure such that the bottom portion of the one of the spacer elements is in direct contact with the isolation feature and the S/D structure.

8. A semiconductor device structure, comprising:
    a first isolation feature over a semiconductor substrate;
    a fin structure in the first isolation feature;
    an active gate stack and a dummy gate stack over the fin structure and the first isolation feature and adjacent to each other, wherein the active gate stack has a first width and the dummy gate stack has a second width that is equal to the first width;
    source or drain (S/D) structures on opposite sides of the dummy gate stack;
    a dielectric layer covering at least one of the source or drain (S/D) structures;
    a capping layer separating the dielectric layer from the at least one of the source or drain (S/D) structures and from the dummy gate stack; and a second isolation feature extending into the fin structure and below the dummy gate stack, wherein only one side of the second isolation feature is in direct contact with one of the S/D structures, wherein the second isolation feature has a top width that is equal to the first width, and wherein the second isolation feature has a first sidewall and a second sidewall opposite to the first sidewall, and bottoms of the first sidewall and the second sidewall are adjoined each other.

9. The semiconductor device structure as claimed in claim 8, wherein the dummy gate stack comprises a gate electrode and a gate dielectric layer, and wherein an interface between the first isolation feature and the gate dielectric layer is closer to a bottom of the second isolation feature than a top of the second isolation feature.

10. The semiconductor device structure as claimed in claim 8, wherein a thickness of the second isolation feature is substantially equal to the thickness of the fin structure.

11. The semiconductor device structure as claimed in claim 8, wherein
the dielectric layer covers the first isolation feature and surrounds the dummy gate stack; and
the capping layer is between the dielectric layer and the first isolation feature, and the second isolation feature is spaced apart from the capping layer.

12. The semiconductor device structure as claimed in claim 8,
wherein a top surface of the second isolation feature is narrower than a distance between the S/D structures.

13. The semiconductor device structure as claimed in claim 8, further comprising:
a spacer element covering a sidewall of the dummy gate stack, wherein a bottom portion of the spacer element extends into the fin structure and between the isolation feature and the one of the S/D structures such that the bottom portion of the spacer element is in direct contact with the second isolation feature and the one of the S/D structures.

14. A semiconductor device structure, comprising:
a first isolation feature over a semiconductor substrate;
a fin structure in the first isolation feature;
a dummy gate stack and active gate stacks over the first isolation feature and extends across the fin structure, wherein the dummy gate stack is between the active gate stacks, and wherein the dummy gate stack has a first width and comprises a gate electrode with a second width, and one of the active gate stacks has a third width that is equal to the first width and comprises a gate electrode with a fourth width that is equal to the second width;
source or drain (S/D) structures in the fin structure and on opposite sides of the dummy gate stack;
a dielectric layer covering at least one of the source or drain (S/D) structures and between the dummy gate stack and at least one of the active gate stacks;
a capping layer separating the dielectric layer from the at least one of the source or drain (S/D) structures and extending on sidewalls of the dielectric layer; and
a second isolation feature extending into the fin structure from a bottom of the dummy gate stack, wherein one of the S/D structures is spaced apart from the second isolation feature by the fin structure, wherein only one side of the second isolation feature is in direct contact with the other one of the S/D structures, and wherein the second isolation feature has an inverted triangle profile, as viewed from a direction substantially parallel to an extending direction of the dummy gate stack,
wherein the second isolation feature gradually shrinks along a direction from the fin structure towards the semiconductor substrate, so that a bottom of a first sidewall of the second isolation feature overlaps a bottom of an opposing second sidewall of the second isolation feature in the fin structure, as viewed from a top-view perspective.

15. The semiconductor device structure as claimed in claim 14, wherein a bottom of the second isolation feature is lower than bottoms of the S/D structures.

16. The semiconductor device structure as claimed in claim 14, further comprising:
a spacer element over a sidewall of the dummy gate stack, wherein a bottom portion of the spacer element extends into the fin structure and between the isolation feature and the other one of the S/D structures such that the bottom portion of the spacer element is in direct contact with the second isolation feature and the other one of the S/D structures.

17. The semiconductor device structure as claimed in claim 14, wherein a top surface of the second isolation feature is narrower than a distance between the S/D structures.

18. The semiconductor device structure as claimed in claim 14, wherein the dielectric layer covers the first isolation feature and surrounds the dummy gate stack and the active gate stacks, and the dielectric layer is separated from the second isolation feature by the dummy gate stack.

19. The semiconductor device structure as claimed in claim 14, wherein an interface between the first isolation feature and the bottom of the dummy gate stack is closer to a bottom of the second isolation feature than a top of the second isolation feature.

20. The semiconductor device structure as claimed in claim 14, further comprising spacer elements formed over opposing sidewalls of the dummy gate stack, wherein a width of the dummy gate stack defined by a distance between the spacer elements is substantially equal to a top width of the second isolation feature.

* * * * *